US009589793B2

(12) United States Patent
Ning et al.

(10) Patent No.: US 9,589,793 B2
(45) Date of Patent: Mar. 7, 2017

(54) LATERALLY VARYING II-VI ALLOYS AND USES THEREOF

(75) Inventors: Cun-Zheng Ning, Chandler, AZ (US); Anlian Pan, Tempe, AZ (US)

(73) Assignee: Arizona Board of Regents, A Body Corporate Acting For And On Behalf of Arizona State University, Scottsdale, AZ (US)

( * ) Notice: Subject to any disclaimer, the term of this patent is extended or adjusted under 35 U.S.C. 154(b) by 1427 days.

(21) Appl. No.: 13/126,864

(22) PCT Filed: Nov. 6, 2009

(86) PCT No.: PCT/US2009/063600
§ 371 (c)(1),
(2), (4) Date: Jul. 26, 2011

(87) PCT Pub. No.: WO2010/054231
PCT Pub. Date: May 14, 2010

(65) Prior Publication Data
US 2011/0272744 A1 Nov. 10, 2011

Related U.S. Application Data

(60) Provisional application No. 61/112,144, filed on Nov. 6, 2008.

(51) Int. Cl.
*H01L 31/06* (2012.01)
*H01L 21/02* (2006.01)
(Continued)

(52) U.S. Cl.
CPC .... *H01L 21/02557* (2013.01); *H01L 21/0256* (2013.01); *H01L 21/0262* (2013.01);
(Continued)

(58) Field of Classification Search
CPC .......................................... H01L 31/06
(Continued)

(56) References Cited

U.S. PATENT DOCUMENTS 4,566,918 A 1/1986 Irvine
2007/0252136 A1* 11/2007 Lieber et al. ................. 257/24

FOREIGN PATENT DOCUMENTS

EP 0322050 A2 6/1989

OTHER PUBLICATIONS

Schubert et al. Solid-state light sources getting smart. Science 308, 1274-1278 (2005).
(Continued)

*Primary Examiner* — Marvin Payen
(74) *Attorney, Agent, or Firm* — McDonnell Boehnen Hulbert & Berghoff LLP

(57) ABSTRACT

Described herein are semiconductor structures comprising laterally varying II-VI alloy layer formed over a surface of a substrate. Further, methods are provided for preparing laterally varying II-VI alloy layers over at least a portion of a surface of a substrate comprising contacting at least a portion of a surface of a substrate within a reaction zone with a chemical vapor under suitable reaction conditions to form a laterally varying II-VI alloy layer over the portion of the surface of the substrate, wherein the chemical vapor is generated by heating at least two II-VI binary compounds; and the reaction zone has a temperature gradient of at least 50-100° C. along an extent of the reaction zone. Also described here are devices such as lasers, light emitting diodes, detectors, or solar cells that can use such semiconductor structures. In the case of lasers, spatially varying wavelength can be realized while in the case of solar cells and detectors multiple solar cells can be achieved laterally where each cell absorbs solar energy of a given wavelength
(Continued)

range such that entire solar spectrum can be covered by the said solar cell structure. For LED applications, spatial variation of alloy composition can be used to engineer colors of light emission.

35 Claims, 32 Drawing Sheets

(51) Int. Cl.
H01L 31/0296 (2006.01)
H01L 31/0352 (2006.01)
H01L 33/02 (2010.01)
H01L 33/28 (2010.01)
H01S 5/10 (2006.01)
H01S 5/327 (2006.01)

(52) U.S. Cl.
CPC .. *H01L 21/02491* (2013.01); *H01L 21/02562* (2013.01); *H01L 21/02568* (2013.01); *H01L 21/02636* (2013.01); *H01L 31/0296* (2013.01); *H01L 31/0352* (2013.01); *H01L 33/02* (2013.01); *H01L 21/02422* (2013.01); *H01L 33/28* (2013.01); *H01L 2924/0002* (2013.01); *H01S 5/1042* (2013.01); *H01S 5/327* (2013.01)

(58) Field of Classification Search
USPC .................. 257/201, 614, E29.096, E29.097
See application file for complete search history.

(56) References Cited

OTHER PUBLICATIONS

Wu et al. Superior radiation resistance of $In_{1-x}Ga_xN$ alloys: Full-solar-spectrum photovoltaic material system. J. Appl. Phys. 94, 6477-6482 (2003).
Kung et al.. III-Nitride wide bandgap semiconductors: A survey of the current status and future trends of the material and device technology. Opto-Electron. Rev. 8, 201-239 (2000).
Schenk et al. Indium incorporation above 800 _C during metalorganic vapor phase epitaxy of InGaN. Appl. Phys. Lett. 75, 2587-2589 (1999).
Shan et al. Optical properties of $InxGa1—xN$ alloys grown by metalorganic chemical vapor deposition. J. Appl. Phys. 84, 4452-4458 (1998).
Shimizu et al. Metalorganic vapor phase epitaxy growth of $(InxGa1—xN/GaN)n$ layered structures and reduction of indium droplets. J. Cryst. Growth 145, 209-213 (1994).
Yoshimoto et al. Photoluminescence of indium gallium nitride films grown at high temperature by metalorganic vapor phase epitaxy. Appl. Phys. Lett. 59, 2251-2253 (1991).
Wu et al. Small band gap bowing in $In1—xGaxN$ alloys. Appl. Phys. Lett. 80, 4741-4743 (2002).
Takahashi et al. Vapor-phase epitaxy of $InxGa1—xN$ using chloride sources. J. Cryst. Growth 189-190, 37-41 (1998).
Davydov et al. Band gap of hexagonal InN and InGaN alloys. Phys. Status Solidi B 234, 787-795 (2002).
Lu et al. Dynamic scaling of the growth process of GaN thin films deposited on sapphire substrates by HVPE. Phys. Lett. A 327, 78-82 (2004).
Liliental-Weber et al. Compositional modulation in $InxGa1—xN$: TEM and X-ray studies. J. Electron Microscopy 54, 243-250 (2005).
Kuykendall et al. Crystallographic alignment of high-density gallium nitride nanowire arrays. Nature Mater. 3, 524-528 (2004).
Sun et al. High efficiency and brightness of blue light emission from dislocation-free InGaN/GaN quantum well nanorod arrays. Appl. Phys. Lett. 87, 093115 (2005).
Ertekin et al. Equilibrium limits of coherency in strained nanowire heterostructures. J. Appl. Phys. 97, 114325 (2005).
Fuhrmann et al. Optimization scheme for the quantum efficiency of GaInN-based green light-emitting diodes. Appl. Phys. Lett. 88, 071105 (2006).
Fujrmann et al. Optimizing the internal quantum efficiency of GaInN SQWstructures for green light emitters. Phys. Status Solidi C 3, 1966-1969 (2006).
Qian et al. Core/Multishell nanowire heterostructures as multicolor, high-efficiency light-emitting diodes. Nano Lett. 5, 2287-2291 (2005).
Kim et al. High-brightness light emitting diodes using dislocation-free indium gallium nitride/gallium nitride multiquantum-well nanorod arrays. Nano Lett. 4, 1059-1062 (2004).
Kim et al. Formation of InGaN nanorods with indium mole fractions by hydride vapor phase epitaxy. Phys. Status Solidi B 241, 2802-2805 (2004).
Kumagai et al. Thermodynamics on tri-halide vapor-phase epitaxy of GaN and $InxGa1—xN$ using $GaCl3$ and $InCl3$. J. Cryst. Growth 231, 57-67 (2001).
Scholz et al. Low pressure MOVPE of GaN and GaInN/GaN heterostructures. J. Cryst. Growth 170, 321-324 (1997).
Doppalapudi et al. Phase separation and ordering in InGaN alloys grown by molecular beam epitaxy. J. Appl. Phys. 84, 1389-1395 (1998).
Mattila et al. Predicted bond length variation in wurtzite and zinc-blende InGaN and AlGaN alloys. J. Appl. Phys. 85, 160-167 (1999).
Ho et al. Solid phase immiscibility in GaInN. Appl. Phys. Lett. 69, 2701-2703 (1996).
Caetano et al. Phase stability, chemical bonds, and gap bowing of $InxGa1—xN$ alloys: Comparison between cubic and wurtzite structures. Phys. Rev. B 74, 045215 (2006).
Liliental-Weber et al. Relaxation of InGaN thin layers observed by X-ray and transmission electron microscopy studies. J. Electron. Mater. 30, 439-444 (2001).
Stach et al. Watching GaN nanowires grow. Nano Lett. 3, 867-869 (2003).
Waltereit et al. Nitride semiconductors free of electrostatic fields for efficient white light-emitting diodes. Nature 406, 865-868 (2000).
Shubina et al. Mie resonances, infrared emission, and the band gap of InN. Phys. Rev. Lett. 92, 117407 (2004).
Wu et al. Effects of the narrow band gap on the properties of InN. Phys. Rev. B 66, 201403 (2002).
Pan et al. High-Quality Alloyed $CdSxSe1—x$ Whiskers as Waveguides with Tunable Stimulated Emission J. Phys. Chem. B, 110, 2006, 22313.
Pan et al. Color-Tunable Photoluminescence of Alloyed $CdSxSe1—x$ Nanobelts J. Am. Chem. Soc. 127, 2005, 15692-15693.
Kuykendall et al. Complete composition tunability of InGaN nanowires using a combinatorial approach, Nature Materials 6, 2007, 951.
Pan et al. Super-Broadly Spatial-Wavelength-Tunable Nanowire Lasers on a Single Chip, Nano Letters, 9, 2009, 784.
Green et al. Novel parallel multijunction solar cell. Appl. Phys. Lett. 65, 2907 (1994).
Bloss et al. Dispersive concentrating systems based on transmission phase holograms for solar applications. Appl. Opt., 21, 1982, 3739.
Ludman, J.E., Holographic solar concentrator. Appl. Opt., 21, 1982, 3057.
Barnett et al. Milestones toward 50% efficient solar cell modules, 22nd European Photovoltaic Solar Energy Conference, Milan, Italy, Sep. 3, 2007.
Tredicucci et al. A multiwavelength semiconductor laser. Nature 396, 350-353 (1998).
Martensson et al. Epitaxial III-V nanowires on silicon. Nano Lett. 4, 1987-1990 (2004).
Bjork et al. One-dimensional steeplechase for electrons realized. Nano Lett. 2, 87-89 (2002).
Pan et al. Fabrication and photoluminescence of high-quality ternary CdSSe nanowires and nanoribbons. Nanotech. 17, 1083-1086 (2006).

(56) References Cited

OTHER PUBLICATIONS

Kuykendall et al. Complete composition tunability of InGaN nanowires using a combinatorial approach. Nature Materials 6, 951-956 (2007).

Liu et al. Wavelength controlled lasing in ZnxCd1—xS single-crystal nanoribbons. Adv. Mater. 17, 1372-1377 (2005).

Shan et al. ZnxCd1—xSe alloy nanowires covering the entire compositional range grown by metalorganic chemical vapor deposition. Appl. Phys. Lett. 87, 033108 (2005).

Lu et al. Rational synthesis and tunable optical properties of quasialigned Zn1—xMgxO nanorods. Appl. Phys. Lett. 91, 193108 (2007).

Huang et al. Room-temperature ultraviolet nanowire nanolasers. Science 292, 1897-1899 (2001).

Duan et al. Single-nanowire electrically driven lasers. Nature 421, 241-245 (2003).

Agarwal et al. Lasing in single cadmium sulfide nanowire optical cavities. Nano Lett. 5, 917-920 (2005).

Zapien et al. Room temperature single nanoribbon lasers. Appl. Phys. Lett. 84, 1189-1191 (2004).

Chin et al. Near-infrared semiconductor subwavelength-wire lasers. Appl. Phys. Lett. 88, 163115 (2006).

Maslov et al. Modal gain in a semiconductor nanowire laser with anisotropic bandstructure. IEEE J. Quant. Elect. 40, 1389-1397 (2004).

Yu et al. Cadmium Selenide quantum wires and the transition from 3D to 2D confinement. J. Am. Chem. Soc. 125, 16168-16169 (2003).

Barrelet et al. Nanowire photonic circuit elements. Nano Lett. 4, 1981-1985 (2004).

Ma et al. High-performance logic circuits constructed on single CdS nanowires. Nano Lett. 7, 3300-3304 (2007).

Hill, R. Energy-gap variations in semiconductor alloys. J. Phys. C: Solid State Phys. 7. 521-526 (1974).

Tredicucci et al. A multiwavelength semiconductor laser. Nature, 396, 350 (1998).

Pan et al. Continuous Alloy-Composition Spatial Grading and Superbroad Wavelength-Tunable Nanowire Lasers on a Single Chip. Nano Lett. 2009, 9, 784.

Pan et al. Si-CdSSe Core/Shell Nanowires with Continuously Tunable Light Emission. Nano Lett. 2008, 8, 3413.

Lim et al. Controlled Growth of Ternary Alloy Nanowires Using Metalorganic Chemical Vapor Deposition. Nano Lett. 2008, 8, 1386.

Su et al. Growth of AlGaN nanowires by metalorganic chemical vapor deposition. Appl. Phys. Lett. 2005, 87, 183108.

Liu et al. Wavelength-tunable lasing in single-crystal CdS1—xSex nanoribbons. Nanotechnology 2007, 18, 365606.

Feng et al. Empirical pseudopotential bandstructure calculation for Zn1—xCdxSySe1—y quaternary alloy. J. Appl. Phys. 1993, 74, 3948.

Vijayalakshmi et al. Structural and bandgap studies of ZnSxCdSe1—x thin films. Semicond. Sci. Technol. 1994, 9, 1062.

Koestner et al. Kinetics of molecularbeam epitaxial HgCdTe growth. J. Vac. Sci. Technol. A, vol. 6, No. 4, 2834-2839 (1988).

Maslov et al. Reflection of guided modes in a semiconductor nanowire laser. Appl. Phys. Lett. 83, 1237-1239 (2003).

Marques et al. Statistical model applied to AxByC1—x—yD quaternary alloys: Bond lengths and energy gaps of AlxGayIn1—x—yX (X=As, P, or N) systems. Phys. Rev. B., 73, 235205 (2006).

Perkins et al. Growth of thick GaN films by halide vapor phase epitaxy. Proc. Electrochem. Soc. 96-5, 336-341 (1996).

* cited by examiner (a)

(b)

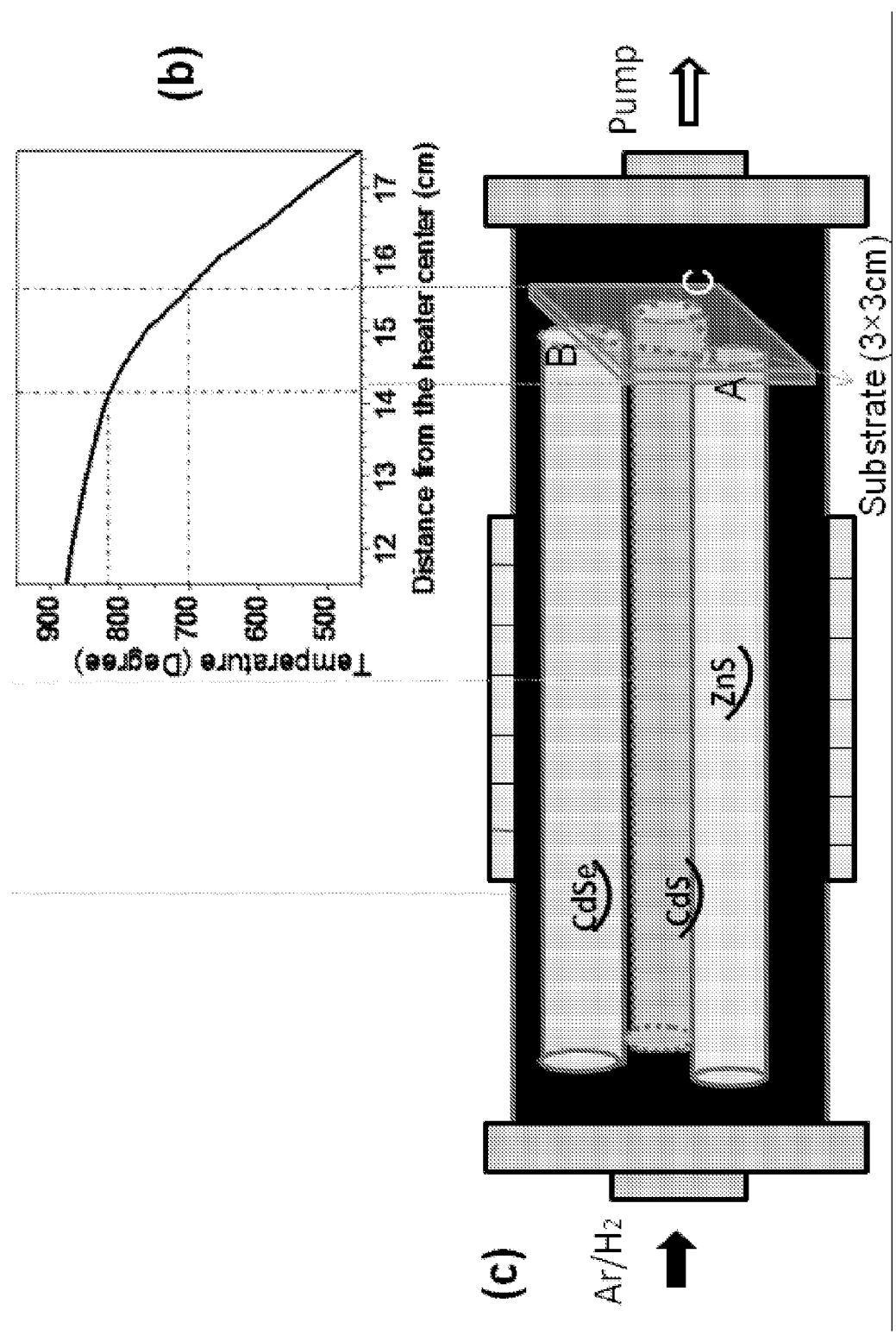
FIG. 22, CONT'D

LATERALLY VARYING II-VI ALLOYS AND USES THEREOF

CROSS-REFERENCE TO RELATED APPLICATIONS

This application claims the benefit of the filing date of U.S. Provisional Application Ser. No. 61/112,144, filed Nov. 6, 2008, which is hereby incorporated by reference in its entirety.

STATEMENT OF GOVERNMENT FUNDING

The invention described herein was made in part with government support under grant number W911NF-08-1-0471, awarded by US Army Research Office. The United States Government has certain rights in the invention.

FIELD OF THE INVENTION

The invention generally relates to semiconductor structures comprising laterally varying II-VI alloys, methods for their preparation, and uses thereof. Examples of such uses include, but are not limited to, spatially wavelength varying lasers and light emitting diodes, multi-color detectors and laterally distributed solar cells where each cell absorbs one given wavelength range of solar radiation.

BACKGROUND OF THE INVENTION

Alloying two semiconductors of different bandgaps generally results in a semiconductor of bandgap different from that of either original constituent. Varying the relative compositions of the two constituents will lead to the corresponding change in bandgap. This has long been one of the standard methods of achieving bandgaps (and thus the operating wavelength of an optical device) that are not provided by naturally-occurring semiconductors. Unfortunately, this method of achieving wavelength variability is severely limited by existing methods of growing planar epitaxial heterostructures of semiconductor thin films on a crystalline substrate. Such methods invariably require a close match of lattice constants of the substrate and the alloy materials to be grown (or a means of relieving the strain due to lattice mismatch). The very limited lattice constant mismatch required for growing high quality wafers has been the main obstacle of making semiconductor-based optoelectronic devices (such as lasers, detectors, multi-color detectors and solar cells) with controllable and widely variable (or tunable) operating wavelengths. With the advent of nanowire based technology, such restrictions are removed or are very much relaxed, depending on the method of growth. For epitaxial growth of nanowires, the relaxed requirement of lattice matching has led to the growth of materials with a mismatch as large as 8%. InP, GaAs, and other III-V nanowires have been epitaxially grown on Si (see, Martensson et al., Nano Lett. 4, 1987-1990 (2004)) and InAs and InP nanowires have been grown into nanowire heterostructures (see, Bjork et al., Nano Lett. 2, 87-89 (2002)) despite large lattice mismatches. In addition, nanowires can also be grown using an amorphous substrate as simply a mechanical support, allowing alloy nanowire growth with a much larger range of composition variation than is possible with planar growth technologies. This has led to the growth of a wide range of alloy compositions between two binary compounds such as CdS and CdSe (see, Pan et al., J. Am. Chem. Soc. 127, 15692 (2005); Pan et al., Nanotech. 17, 1083-1086 (2006)), InN and GaN (see, Kuykendall et al., Nature Materials 6, 951-956 (2007)), ZnS and CdS (see, Liu et al., Adv. Mater. 17, 1372-1377 (2005)), ZnSe and CdSe (see, Shan et al., Appl. Phys. Lett. 87, 033108 (2005)), ZnO and MgO (see, Lu et al., Appl. Phys. Lett. 91, 193108 (2007)), and so on. Such controllable alloy composition variation provides unprecedented access to new wavelength ranges using semiconductor alloys. In this connection, it is worth mentioning that semiconductor nanoparticle (nanocrystal) technology can also provide large range of wavelength flexibility by either alloying or size variation. But for optical applications, nanowire alloys have an additional advantage not available with nanoparticles, since individual nanowires intrinsically provide both channels for electronic conduction and waveguides for optical devices, in addition to serving as a gain/absorbing material. This is why individual nanowires have been shown to act as nanolasers (see, Huang et al., Science 292, 1897-1899 (2001); Johnson, J. C. et al. J. Phys. Chem. B. 105, 11387-11390 (2001); Duan et al., Nature 421, 241-245 (2003); Agarwal et al., Nano Lett. 5, 917-920 (2005); Zapien et al., Appl. Phys. Lett. 84, 1189-1191 (2004); Chin et al., Appl. Phys. Lett. 88, 163115 (2006); Maslov et al., Appl. Phys. Lett. 83, 1237-1239 (2003); Maslov et al., IEEE J. Quant. Elect. 40, 1389-1397 (2004)).

Although various semiconductor alloy nanowires of different compositions have been achieved under separate growth conditions, it is both challenging and important to achieve a full-range composition variation within a single substrate in a single run of growth. To achieve fully tunable lasing within the entire composition range on a single substrate would be even more appealing and challenging.

Therefore there exists a need in the art to provide semiconductor compositions and structural assemblies which enable continuously tunable bandgap on a single substrate. Further, methods for preparing the same which enable straightforward preparation of such semiconductor structures in a single step are needed in the art.

SUMMARY OF THE INVENTION

In one aspect, the invention provides semiconductor structures comprising a substrate and a II-VI alloy layer having an elemental composition formed over a surface of the substrate, wherein the elemental composition of the II-VI alloy layer laterally continuously varies between a first II-VI compound or alloy at a first position over the surface of the substrate and a second II-VI compound or alloy at a second position over the surface of the substrate.

In another aspect, the invention provides methods for preparing a laterally composition-varying II-VI alloy layer over at least a portion of a surface of a substrate comprising contacting at least a portion of a surface of a substrate within a reaction zone with a chemical vapor under suitable reaction conditions to form a laterally composition-varying II-VI alloy layer over the portion of the surface of the substrate, wherein the chemical vapor is generated by heating at least two II-VI binary compounds; and the reaction zone has a temperature gradient of at least 50° C.-100° C. along an extent of the reaction zone, wherein the extent is about 0.5 cm to about 5 cm in length, In another aspect, the invention provides semiconductor structures prepared according to the second aspect of the invention.

In another aspect, the invention provides semiconductor structures comprising a substrate and an II-VI alloy layer having an elemental composition formed over a surface of the substrate, wherein the elemental composition of the II-VI alloy layer continuously laterally varies among a first II-VI compound or alloy at a first position over the surface of the substrate and a second II-VI compound or alloy at a second position over the surface of the substrate;

the second II-VI compound or alloy at the second position over the surface of the substrate and a third II-VI compound or alloy at a third position over the surface of the substrate; and the third II-VI compound or alloy at the third position over the surface of the substrate and the first II-VI compound or alloy at the first position over the surface of the substrate;

wherein the first, second, and third positions are not co-linear.

In another aspect, the invention provides $Zn_xCd_{1-x}S_ySe_{1-y}$ nanowires wherein x and y are each greater than or equal to 0 and less than or equal to 1.

In another aspect, the invention provides methods for preparing $Zn_xCd_{1-x}S_ySe_{1-y}$ nanowires comprising contacting at least a portion of a surface of a substrate with a chemical vapor under suitable reaction conditions to form one or more $Zn_xCd_{1-x}S_ySe_{1-y}$ nanowires over the portion of the surface of the substrate, wherein the chemical vapor is generated by heating ZnS to a first temperature and CdSe to a second temperature that is less than the first temperature.

In another aspect, the invention provides lasers and/or light emitting diodes comprising $Zn_xCd_{1-x}S_ySe_{1-y}$ nanowires or a semiconductor structure according to the preceding aspects of the invention, whose wavelength of operation changes laterally according to the bandgap variation of the said semiconductor alloy.

In another aspect, the invention provides solar cells comprising $Zn_xCd_{1-x}S_ySe_{1-y}$ nanowires or a semiconductor structure according to the preceding aspects of the invention In another aspect, the invention provides solar cell devices where different wavelength bands of solar radiation are directed onto, and absorbed by, different cells of FIG. 7(a), or FIG. 8(a), FIG. 9, FIG. 18, or FIG. 19, with bandgap ranges related to the said wavelength bands.

In another aspect, the invention provides multispectral detectors comprising $Zn_xCd_{1-x}S_ySe_{1-y}$ nanowires or a semiconductor structure according to the preceding aspects of the invention.

In another aspect, the invention provides a multispectral detector devices where different wavelength bands of a multispectral-component signal are directed onto, and absorbed by, different cells of FIG. 7(a), or FIG. 8(a), FIG. 9, FIG. 18, or FIG. 19, with bandgap ranges related to the said wavelength bands. Each cell in those figures is biased electrically to collect the electrical current for that wavelength band.

BRIEF DESCRIPTION OF THE DRAWINGS

FIG. 8b illustrates a method for forming the device illustrated in FIG. 8a.

DETAILED DESCRIPTION OF THE INVENTION

Herein, we describe the growth of ternary and quaternary semiconductor alloy nanowires and the growth of alloys having controllable and variable compositions, leading to a tunable bandgap change in the entire visible spectrum. Such unique nanostructured materials with controllable alloy composition can be used a wide range of applications in color engineered display and lighting, multispectral detectors, spectrometer on-a-chip, full-spectrum solar cells, and superbroadly tunable nanolasers.

In particular, we describe a semiconductor laser chip with a wide wavelength tuning range, continuously tunable over the length of the chip. Such a multiwavelength laser chip can be used for a wide variety of applications, such as an on-chip wavelength division multiplexing (WDM) source, a multiwavelength sensor, an optimizable white-light source, red-green-blue (RGB) display, and nanophotonics integrated circuits.

Figure 12:
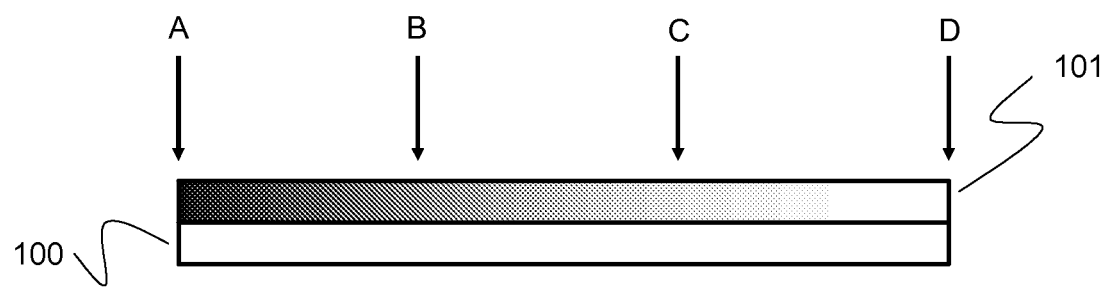
FIG. 12 shows an embodiment of a semiconductor structure of the invention.

Starting with FIG. 12, the invention provides semiconductor structures comprising a substrate (100) and a laterally varying II-VI alloy layer (101) formed over a surface of the substrate. As illustrated by the gradient shading of layer 101, the elemental composition of the laterally varying II-VI alloy layer continuously varies between a first II-VI compound or alloy at a first position (A) over the surface of the substrate and a second II-VI compound or alloy at a second position over the surface of the substrate. As illustrated in FIG. 12, and as discussed below, the second position can be any one of points (B), (C), or (D). Different compound combinations can be used for different intervals (A-B, B-C, or C-D etc) to achieve different bandgaps of different alloys.

Generally, the lateral bandgap variation of the II-VI alloy layer is with respect to a pair of II-VI compounds selected from the constituent compounds of the first and second II-VI compounds or alloys. From the first to second positions, one II-VI compound of the first pair continuously increases in compositional abundance of the II-VI alloy layer and the other II-VI compound of the first pair continuously decreases in compositional abundance of the II-VI alloy layer. For example, when the first II-VI compound or alloy is CdS (an II-VI compound) and the second compound or alloy is CdSe (an II-VI compound), then the variation in the II-VI layer is with respect to the compositional abundance of CdS (or alternately, CdSe) with respect to the total composition of the II-VI alloy layer. "Constituent compounds" of a II-VI alloy, as used herein, refer to binary II-VI compounds which can be formed from the elemental components of the alloy; for example, the constituent compounds of a CdZnS alloy are CdS and ZnS. In another example, the constituent compounds of a CdZnSSe alloy are CdS, CdSe, ZnS, and ZnSe.

For example, returning to FIG. 12, for a II-VI alloy layer comprising $CdS_xSe_{1-x}$, the composition of the II-VI alloy layer (101) can continuously change from a first (A) to second position (D) with respect to a pair of constituent II-VI compounds, in this case, CdS and CdSe. Moving from left to right from positions A to B to C to D in FIG. 12, the compositional abundance of CdS and CdSe, reflected by the variation of the variable x in the preceding formula, can continuously change within the II-VI alloy layer such that x at point (A) is greater than at point (B); x at point (B) is greater than at point (C); and x at point (C) is greater than at point (D). Alternatively, the compositional abundance of CdS and CdSe, reflected by the variation of the variable x, can continuously change within the II-VI alloy layer such that x at point (A) is less than at point (B); x at point (B) is less than at point (C); and x at point (C) is less than at point (D). The continuous variation in the composition of the II-VI alloy layer between any two points over the substrate can be linear or nonlinear, or a combination thereof or other forms depending on a given application.

Another mode of lateral alloy composition variation can be achieved by making different ternary alloys in different intervals. For example, we can have $CdS_xSe_{1-x}$ between A and B with x=0 at A and x=1 at B. This is followed by $CdSe_{1-y}Te_y$ from B to C with y=0 at B and y=1 at C, such that continuous variation from CdS at A, CdSe at B and CdTe at C can be achieved from A to C via B. The same can be done beyond C with another alloy sharing a common element with CdTe.

Figure 13:
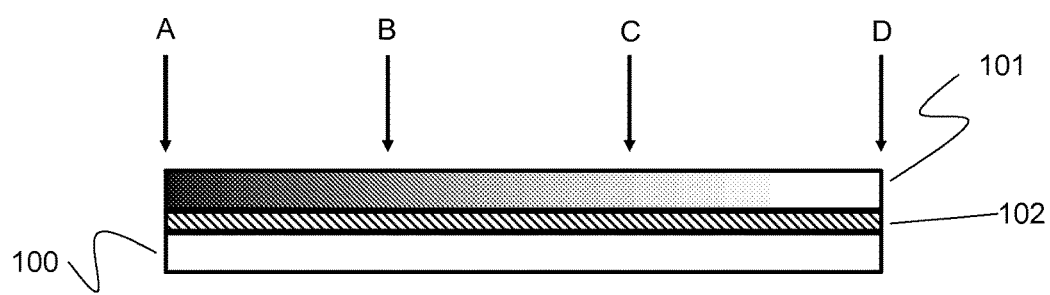
FIG. 13 shows an embodiment of a semiconductor structure of the invention comprising a catalyst layer formed on the substrate.

As shown in FIG. 13, the semiconductor structures can further comprise a catalyst layer formed (102) directly on the substrate, wherein the laterally varying II-VI alloy layer is formed directly on the catalyst layer. In certain embodiments, the catalyst layer is a patterned layer. For example, the catalyst layer can be a discontinuous layer which defines a laterally oriented series of cells on the surface of the substrate. In certain other embodiments, the catalyst layer comprises Au.

In any of the preceding II-VI alloy layers, the II-VI compound or alloy at each of the first and second positions can each independently comprise a (CdZnMgHg)(SSeTe) compound or alloy. For example, each II-VI compound or alloy can be a $CdS_{1-z}Se_z$ compound or alloy. In one particular example, z is about 0 at the first position and about 1 at the second position. In the latter example, the first II-VI compound or alloy is CdS and the second II-VI compound or alloy is CdSe.

In another example, the II-VI compound or alloy can be a $Cd_{1-a}Zn_aS$ compound or alloy at each of the first and second positions. In one particular example, a is about 0 at the first position and about 1 at the second position. In this example, the first II-VI compound or alloy is CdS and the second II-VI compound or alloy is ZnS.

Further, in any of the preceding embodiments, the II-VI alloy layer can further vary between the second II-VI alloy or compound at the second position and a third II-VI compound or alloy at a third position over the surface of the substrate. For example, referring again to FIGS. 12 and 13, point (A) can represent the first position, point (C) can represent the second position, and point (D) can represent the third position. From the second (C) to the third position (D), the II-VI alloy layer can vary with respect to a second pair of II-VI compounds selected from the constituent compounds of the second and third II-VI compounds or alloys, wherein one II-VI compound of the second pair continuously increases in compositional abundance of the II-VI alloy layer and the other II-VI compound of the second pair continuously decreases in compositional abundance of the II-VI alloy layer.

In one example, each II-VI compound or alloy at the first and second positions, independently, can be a $Cd_{1-x}Zn_xS_{1-y}Se_y$ alloy. In one embodiment, y can be about 1 and x can be about 0 at the first position; and y can be about 0 and x can be about 1 at the second position. In another embodiment, y can be about 0 and x can be about 1 at the first position; and y can be about 1 and x can be about 0 at the second position. In another embodiment, y can be about 1 and x can be about 1 at the first position; and y can be about 0 and x can be about 0 at the second position. In another embodiment, y can be about 0 and x can be about 0 at the first position; and y can be about 1 and x can be about 1 at the second position. For example, moving from left to right from positions A to B to C to D in FIG. 12, the compositional abundance of the $Cd_{1-x}Zn_xS_{1-y}Se_y$ alloy can continuously change within the II-VI alloy layer such that x at point (A) is greater than at point (B); x at point (B) is greater than at point (C); and x at point (C) is greater than at point (D); and y at point (A) is greater than at point (B); y at point (B) is greater than at point (C); and y at point (C) is greater than at point (D). Alternatively, x at point (A) is greater than at point (B); x at point (B) is greater than at point (C); and x at point (C) is greater than at point (D); and y at point (A) is less than at point (B); y at point (B) is less than at point (C); and y at point (C) is less than at point (D). Alternatively, x at point (A) is less than at point (B); x at point (B) is less than at point (C); and x at point (C) is less than at point (D); and y at point (A) is greater than at point (B); y at point (B) is greater than at point (C); and y at point (C) is greater than at point (D). Alternatively, x at point (A) is less than at point (B); x at point (B) is less than at point (C); and x at point (C) is less than at point (D); and y at point (A) is less than at point (B); y at point (B) is less than at point (C); and y at point (C) is less than at point (D). The continuous variation in the composition of the II-VI alloy layer between any two points over the substrate can be linear or nonlinear, or a combination thereof or other forms depending on a given application.

In another example, each II-VI compound or alloy at the first, second, and third positions, independently, can be a $Cd_{1-x}Zn_xS_{1-y}Se_y$ alloy. In one embodiment, y can be about 1 at the first position and about 0 at the second position and x is essentially constant between the first and second positions. In this embodiment, the first II-VI compound or alloy is a $Cd_{1-x}Zn_xSe$ alloy and the second II-VI compound or alloy is a $Cd_{1-x}Zn_xS$ alloy. In another embodiment, x is about 0 at the second position and about 0.6 at the third position and y is essentially constant between the second and third positions, i.e., the second II-VI compound or alloy is a $CdS_{1-y}Se_y$ alloy and the third II-VI compound or alloy is a $Cd_{0.4}Zn_{0.6}S_{1-y}Se_y$ alloy. When the two preceding embodiments are combined, then the first II-VI compound or alloy is CdSe, the second II-VI compound or alloy is CdS, and the third II-VI compound or alloy is a $Cd_{0.4}Zn_{0.6}S$ alloy; further, between the second and third positions, the II-VI alloy layer varies with respect to the compositional abundance of CdS and ZnS, the constituent compounds of the II-VI alloy layer between the second and third positions.

The first and last positions defining the laterally varying II-VI alloy layer, as discussed above, (e.g., first and second or first and third positions, etc.) can define a portion of a substrate surface or an entire extent of the substrate surface (i.e., the entire length or width of a surface). In certain embodiments, the first and second (or third) positions are separated by a distance about 2 cm or less. In certain other embodiments, the first and second (or third) positions are separated by a distance of about 0.5 cm to 5 cm. In the cases where the first and second (or third) positions define or an entire extent of the substrate surface, then the substrate can have an extent (e.g., length or width) of about 2 cm or less; or about 0.5 cm to 5 cm.

In another aspect, the invention provides semiconductor structures comprising a substrate and an II-VI alloy layer having an elemental composition formed over a surface of the substrate, wherein the elemental composition of the II-VI alloy layer continuously laterally varies among a first II-VI compound or alloy at a first position over the surface of the substrate and a second II-VI compound or alloy at a second position over the surface of the substrate;

the second II-VI compound or alloy at the second position over the surface of the substrate and a third II-VI compound or alloy at a third position over the surface of the substrate; and the third II-VI compound or alloy at the third position over the surface of the substrate and the first II-VI compound or alloy at the first position over the surface of the substrate;

wherein the first, second, and third positions are not co-linear.

In one embodiment, each II-VI compound or alloy independently comprises a (CdZnMgHg)(SSeTe) compound or alloy. In another embodiment, each II-VI compound or alloy is a $Zn_xCd_{1-x}S_ySe_{1-y}$ compound or alloy. For example, at the first position, the II-VI compound or alloy comprises, consists essentially of, or consists of ZnS; at the second position, the II-VI compound or alloy comprises, consists essentially of, or consists of CdSe; and at the third position, the II-VI compound or alloy comprises, consists essentially of, or consists of CdS.

For any of the preceding aspects, the II-VI alloy layers can comprise, consists essentially of, or consists of any morphological form of the II-VI alloys. For example, the II-VI alloy layers can be a continuous layer, such as an epitaxial, polycrystalline, or amorphous layer, which laterally varies in composition. In other examples, the II-VI alloy layers can be a discontinuous layer which laterally varies in composition. Examples of suitable discontinuous layers include, but are not limited to discrete islands, dots (e.g., quantum dots), and/or nanowires, where the composition of the discrete elements varies as described above. In certain example, the laterally varying II-VI alloy layer comprises, consists essentially of, or consists of nanowires.

The II-VI alloy layers can be formed over any the substrate compatible with the II-VI alloy itself as well as the conditions utilized for preparing the layers (as discussed below). In certain examples, the substrate comprises Si, $SiO_2$ or other materials, including, but not limited to compound semiconductors. Such substrates can be n- or p-doped as is familiar to those skilled in the art. In one embodiment, the substrate comprises $SiO_2$. The substrate can be a size suitable for the intended purpose.

For electronically integrating the preceding semiconductor structures for devices such as lasers, light emitting diodes, multi-color detectors or solar cells, the structures can further comprise one or more electrical contacts in electrical communication with the II-VI alloy layer. In certain embodiments, each electrical contact is an interdigitated electrode. In certain other embodiments, the electrical contact is a doped material (i.e., n- or p-doped material). Generally, when the substrate is n- or p-doped then the electrical contact is the other of n- or p-doped. In certain embodiments, the semiconductor structures can comprise a plurality of electrical contacts each at one of a plurality of positions along an extent of the substrate surface, each in electrical communication with the II-VI alloy layer.

The semiconductor structures described above can be prepared according to methods comprising contacting at least a portion of a surface of a substrate within a reaction zone with a chemical vapor under suitable reaction conditions to form a laterally varying II-VI alloy layer over the portion of the surface of the substrate. Generally, the chemical vapor is generated by heating at least two II-VI binary compounds; and the reaction zone has a temperature gradient of at least about 50° C. to about 100° C. temperature differential along an extent of the reaction zone, wherein the extent is about 0.5 cm to about 5 cm in length.

In certain embodiments, the chemical vapor comprises a carrier gas, for example, Ar, Ne, He, $H_2$, or mixtures thereof. In one embodiment, the carrier gas is a mixture of Ar and $H_2$ (e.g., 5% $H_2$/Ar). In one embodiment, the carrier gas is He.

In certain embodiments, the chemical vapor flow rate can be about 50 sccm. However, other flow rates can also be used, as is known to those skilled in the art For example, the chemical vapor can have a flow rate of about 30 sccm to about 60 sccm. In certain embodiments, the flow rate can be about 30 sccm to 80 sccm.

In certain embodiments, the temperature gradient is from about 500° C. to about 850° C.; or from about 500° C. to about 825° C.; or from about 500° C. to about 815° C.; or from about 500° C. to about 800° C.; or from about 500° C. to about 750° C.; or from about 525° C. to about 850° C.; or from about 525° C. to about 815° C.; or from about 525° C. to about 800° C.; or from about 525° C. to about 750° C.; or from about 525° C. to about 725° C.; or from about 550° C. to about 700° C.; or from about 580° C. and about 690° C. In certain other embodiments, the temperature gradient is from about 650° C. to about 850° C.; or from about 675° C. to about 850° C.; or from about 700° C. to about 850° C.; or from about 650° C. to about 825° C.; or from about 675° C. to about 825° C.; or from about 700° C. to about 825° C. The temperature gradient can be is over an extent of about 0.5 cm to 5 cm in length; or about 0.5 cm to 3 cm; or about 0.5 to 2 cm, or about 1 cm in length.

In certain embodiments, the at least two II-VI binary compounds can be CdS and CdSe. In certain embodiments, the at least two II-VI binary compounds can be ZnS and CdSe.

In certain embodiments, the at least two II-VI binary compounds can be CdS and CdSe and the temperature gradient is from about 500° C. to about 750° C. In certain embodiments, the at least two II-VI binary compounds can be CdS and CdSe and the temperature gradient is from about 525° C. to about 750° C. In certain embodiments, the at least two II-VI binary compounds can be CdS and CdSe and the temperature gradient is from about 525° C. to about 725° C. In certain embodiments, the at least two II-VI binary compounds can be CdS and CdSe and the temperature gradient is from about 580° C. and about 690° C.

In certain embodiments, the at least two II-VI binary compounds can be CdS and CdSe; the temperature gradient is from about 500° C. to about 750° C.; and the temperature gradient is over an extent of about 0.5 cm to 5 cm in length. In certain embodiments, the at least two II-VI binary compounds can be CdS and CdSe; the temperature gradient is from about 500° C. to about 750° C.; and the temperature gradient is over an extent of about 0.5 cm to 3 cm in length. In certain embodiments, the at least two II-VI binary compounds can be CdS and CdSe; the temperature gradient is from about 500° C. to about 750° C.; and the temperature gradient is over an extent of about 0.5 to 2 cm in length. In certain embodiments, the at least two II-VI binary compounds can be CdS and CdSe; the temperature gradient is from about 500° C. to about 750° C.; and the temperature gradient is over an extent of about 1 cm in length.

In certain embodiments, the at least two II-VI binary compounds can be CdS and CdSe; the temperature gradient is from about 525° C. to about 750° C.; and the temperature gradient is over an extent of about 0.5 cm to 5 cm in length. In certain embodiments, the at least two II-VI binary compounds can be CdS and CdSe; the temperature gradient is from about 525° C. to about 750° C.; and the temperature gradient is over an extent of about 0.5 cm to 3 cm in length. In certain embodiments, the at least two II-VI binary compounds can be CdS and CdSe; the temperature gradient is from about 525° C. to about 750° C.; and the temperature gradient is over an extent of about 0.5 to 2 cm in length. In certain embodiments, the at least two II-VI binary compounds can be CdS and CdSe; the temperature gradient is from about 525° C. to about 750° C.; and the temperature gradient is over an extent of about 1 cm in length.

In certain embodiments, the at least two II-VI binary compounds can be CdS and CdSe; the temperature gradient is from about 525° C. to about 725° C.; and the temperature gradient is over an extent of about 0.5 cm to 5 cm in length. In certain embodiments, the at least two II-VI binary compounds can be CdS and CdSe; the temperature gradient is from about 525° C. to about 725° C.; and the temperature gradient is over an extent of about 0.5 cm to 3 cm in length. In certain embodiments, the at least two II-VI binary compounds can be CdS and CdSe; the temperature gradient is from about 525° C. to about 725° C.; and the temperature gradient is over an extent of about 0.5 to 2 cm in length. In certain embodiments, the at least two II-VI binary compounds can be CdS and CdSe; the temperature gradient is from about 525° C. to about 725° C.; and the temperature gradient is over an extent of about 1 cm in length.

In certain embodiments, the at least two II-VI binary compounds can be CdS and CdSe; the temperature gradient is from about 580° C. and about 690° C.; and the temperature gradient is over an extent of about 0.5 cm to 5 cm in length. In certain embodiments, the at least two II-VI binary compounds can be CdS and CdSe; the temperature gradient is from about 580° C. and about 690° C.; and the temperature gradient is over an extent of about 0.5 cm to 3 cm in length. In certain embodiments, the at least two II-VI binary compounds can be CdS and CdSe; the temperature gradient is from about 580° C. and about 690° C.; and the temperature gradient is over an extent of about 0.5 to 2 cm in length. In certain embodiments, the at least two II-VI binary compounds can be CdS and CdSe; the temperature gradient is from about 580° C. and about 690° C.; and the temperature gradient is over an extent of about 1 cm in length.

In certain embodiments, the at least two II-VI binary compounds can be ZnS and CdSe and the temperature gradient is from about 650° C. to about 850° C. In certain embodiments, the at least two II-VI binary compounds can be ZnS and CdSe and the temperature gradient is from about 675° C. to about 850° C. In certain embodiments, the at least two II-VI binary compounds can be ZnS and CdSe and the temperature gradient is from about 700° C. to about 850° C. In certain embodiments, the at least two II-VI binary compounds can be ZnS and CdSe and the temperature gradient is from about 650° C. to about 825° C. In certain embodiments, the at least two II-VI binary compounds can be ZnS and CdSe and the temperature gradient is from about 675° C. to about 825° C. In certain embodiments, the at least two II-VI binary compounds can be ZnS and CdSe and the temperature gradient is from about 700° C. to about 825° C.

In certain embodiments, the at least two II-VI binary compounds can be ZnS and CdSe; the temperature gradient is from about 650° C. to about 850° C.; and the temperature gradient can be is over an extent of about 0.5 cm to 5 cm in length. In certain embodiments, the at least two II-VI binary compounds can be ZnS and CdSe; the temperature gradient is from about 650° C. to about 850° C.; and the temperature gradient can be is over an extent of about 0.5 cm to 3 cm. In certain embodiments, the at least two II-VI binary compounds can be ZnS and CdSe; the temperature gradient is from about 650° C. to about 850° C.; and the temperature gradient can be is over an extent of about 0.5 to 2 cm. In certain embodiments, the at least two II-VI binary compounds can be ZnS and CdSe; the temperature gradient is from about 650° C. to about 850° C.; and the temperature gradient can be is over an extent of about 1 cm in length.

In certain embodiments, the at least two II-VI binary compounds can be ZnS and CdSe; the temperature gradient is from about 675° C. to about 850° C.; and the temperature gradient can be is over an extent of about 0.5 cm to 5 cm in length. In certain embodiments, the at least two II-VI binary compounds can be ZnS and CdSe; the temperature gradient is from about 675° C. to about 850° C.; and the temperature gradient can be is over an extent of about 0.5 cm to 3 cm. In certain embodiments, the at least two II-VI binary compounds can be ZnS and CdSe; the temperature gradient is from about 675° C. to about 850° C.; and the temperature gradient can be is over an extent of about 0.5 to 2 cm. In certain embodiments, the at least two II-VI binary compounds can be ZnS and CdSe; the temperature gradient is from about 675° C. to about 850° C.; and the temperature gradient can be is over an extent of about 1 cm in length.

In certain embodiments, the at least two II-VI binary compounds can be ZnS and CdSe; the temperature gradient is from about 700° C. to about 850° C.; and the temperature gradient can be is over an extent of about 0.5 cm to 5 cm in length. In certain embodiments, the at least two II-VI binary compounds can be ZnS and CdSe; the temperature gradient is from about 700° C. to about 850° C.; and the temperature gradient can be is over an extent of about 0.5 cm to 3 cm. In certain embodiments, the at least two II-VI binary compounds can be ZnS and CdSe; the temperature gradient is from about 700° C. to about 850° C.; and the temperature gradient can be is over an extent of about 0.5 to 2 cm. In certain embodiments, the at least two II-VI binary compounds can be ZnS and CdSe; the temperature gradient is from about 700° C. to about 850° C.; and the temperature gradient can be is over an extent of about 1 cm in length.

In certain embodiments, the at least two II-VI binary compounds can be ZnS and CdSe; the temperature gradient is from about 650° C. to about 825° C.; and the temperature gradient can be is over an extent of about 0.5 cm to 5 cm in length. In certain embodiments, the at least two II-VI binary compounds can be ZnS and CdSe; the temperature gradient is from about 650° C. to about 825° C.; and the temperature gradient can be is over an extent of about 0.5 cm to 3 cm. In certain embodiments, the at least two II-VI binary compounds can be ZnS and CdSe; the temperature gradient is from about 650° C. to about 825° C.; and the temperature gradient can be is over an extent of about 0.5 to 2 cm. In certain embodiments, the at least two II-VI binary compounds can be ZnS and CdSe; the temperature gradient is from about 650° C. to about 825° C.; and the temperature gradient can be is over an extent of about 1 cm in length.

In certain embodiments, the at least two II-VI binary compounds can be ZnS and CdSe; the temperature gradient is from about 675° C. to about 825° C.; and the temperature gradient can be is over an extent of about 0.5 cm to 5 cm in length. In certain embodiments, the at least two II-VI binary compounds can be ZnS and CdSe; the temperature gradient is from about 675° C. to about 825° C.; and the temperature gradient can be is over an extent of about 0.5 cm to 3 cm. In certain embodiments, the at least two II-VI binary compounds can be ZnS and CdSe; the temperature gradient is from about 675° C. to about 825° C.; and the temperature gradient can be is over an extent of about 0.5 to 2 cm. In certain embodiments, the at least two II-VI binary compounds can be ZnS and CdSe; the temperature gradient is from about 675° C. to about 825° C.; and the temperature gradient can be is over an extent of about 1 cm in length.

In certain embodiments, the at least two II-VI binary compounds can be ZnS and CdSe; the temperature gradient is from about 700° C. to about 825° C.; and the temperature gradient can be is over an extent of about 0.5 cm to 5 cm in length. In certain embodiments, the at least two II-VI binary compounds can be ZnS and CdSe; the temperature gradient is from about 700° C. to about 825° C.; and the temperature gradient can be is over an extent of about 0.5 cm to 3 cm. In certain embodiments, the at least two II-VI binary compounds can be ZnS and CdSe; the temperature gradient is from about 700° C. to about 825° C.; and the temperature gradient can be is over an extent of about 0.5 to 2 cm. In certain embodiments, the at least two II-VI binary compounds can be ZnS and CdSe; the temperature gradient is from about 700° C. to about 825° C.; and the temperature gradient can be is over an extent of about 1 cm in length.

In certain other embodiments, the chemical vapor can be generated from three II-VI binary compounds, for example, the three II-VI binary compounds can be CdS, CdSe, and ZnS.

In certain embodiments, the three II-VI binary compounds can be CdS, CdSe, and ZnS and the temperature gradient is from about 650° C. to about 850° C. In certain embodiments, the three II-VI binary compounds can be CdS, CdSe, and ZnS and the temperature gradient is from about 675° C. to about 850° C. In certain embodiments, the three II-VI binary compounds can be CdS, CdSe, and ZnS and the temperature gradient is from about 700° C. to about 850° C. In certain embodiments, the three II-VI binary compounds can be CdS, CdSe, and ZnS and the temperature gradient is from about 650° C. to about 825° C. In certain embodiments, the three II-VI binary compounds can be CdS, CdSe, and ZnS and the temperature gradient is from about 675° C. to about 825° C. In certain embodiments, the three II-VI binary compounds can be CdS, CdSe, and ZnS and the temperature gradient is from about 700° C. to about 825° C.

In certain embodiments, the three II-VI binary compounds can be CdS, CdSe, and ZnS; the temperature gradient is from about 650° C. to about 850° C.; and the temperature gradient can be is over an extent of about 0.5 cm to 5 cm in length. In certain embodiments, the three II-VI binary compounds can be CdS, CdSe, and ZnS; the temperature gradient is from about 650° C. to about 850° C.; and the temperature gradient can be is over an extent of about 0.5 cm to 3 cm. In certain embodiments, the three II-VI binary compounds can be CdS, CdSe, and ZnS; the temperature gradient is from about 650° C. to about 850° C.; and the temperature gradient can be is over an extent of about 0.5 to 2 cm. In certain embodiments, the three II-VI binary compounds can be CdS, CdSe, and ZnS; the temperature gradient is from about 650° C. to about 850° C.; and the temperature gradient can be is over an extent of about 1 cm in length.

In certain embodiments, the three II-VI binary compounds can be CdS, CdSe, and ZnS; the temperature gradient is from about 675° C. to about 850° C.; and the temperature gradient can be is over an extent of about 0.5 cm to 5 cm in length. In certain embodiments, the three II-VI binary compounds can be CdS, CdSe, and ZnS; the temperature gradient is from about 675° C. to about 850° C.; and the temperature gradient can be is over an extent of about 0.5 cm to 3 cm. In certain embodiments, the three II-VI binary compounds can be CdS, CdSe, and ZnS; the temperature gradient is from about 675° C. to about 850° C.; and the temperature gradient can be is over an extent of about 0.5 to 2 cm. In certain embodiments, the three II-VI binary compounds can be CdS, CdSe, and ZnS; the temperature gradient is from about 675° C. to about 850° C.; and the temperature gradient can be is over an extent of about 1 cm in length.

In certain embodiments, the three II-VI binary compounds can be CdS, CdSe, and ZnS; the temperature gradient is from about 700° C. to about 850° C.; and the temperature gradient can be is over an extent of about 0.5 cm to 5 cm in length. In certain embodiments, the three II-VI binary compounds can be CdS, CdSe, and ZnS; the temperature gradient is from about 700° C. to about 850° C.; and the temperature gradient can be is over an extent of about 0.5 cm to 3 cm. In certain embodiments, the three II-VI binary compounds can be CdS, CdSe, and ZnS; the temperature gradient is from about 700° C. to about 850° C.; and the temperature gradient can be is over an extent of about 0.5 to 2 cm. In certain embodiments, the three II-VI binary compounds can be CdS, CdSe, and ZnS; the temperature gradient is from about 700° C. to about 850° C.; and the temperature gradient can be is over an extent of about 1 cm in length.

In certain embodiments, the three II-VI binary compounds can be CdS, CdSe, and ZnS; the temperature gradient is from about 650° C. to about 825° C.; and the temperature gradient can be is over an extent of about 0.5 cm to 5 cm in length. In certain embodiments, the three II-VI binary compounds can be CdS, CdSe, and ZnS; the temperature gradient is from about 650° C. to about 825° C.; and the temperature gradient can be is over an extent of about 0.5 cm to 3 cm. In certain embodiments, the three II-VI binary compounds can be CdS, CdSe, and ZnS; the temperature gradient is from about 650° C. to about 825° C.; and the temperature gradient can be is over an extent of about 0.5 to 2 cm. In certain embodiments, the three II-VI binary compounds can be CdS, CdSe, and ZnS; the temperature gradient is from about 650° C. to about 825° C.; and the temperature gradient can be is over an extent of about 1 cm in length.

In certain embodiments, the three II-VI binary compounds can be CdS, CdSe, and ZnS; the temperature gradient is from about 675° C. to about 825° C.; and the temperature gradient can be is over an extent of about 0.5 cm to 5 cm in length. In certain embodiments, the three II-VI binary compounds can be CdS, CdSe, and ZnS; the temperature gradient is from about 675° C. to about 825° C.; and the temperature gradient can be is over an extent of about 0.5 cm to 3 cm. In certain embodiments, the three II-VI binary compounds can be CdS, CdSe, and ZnS; the temperature gradient is from about 675° C. to about 825° C.; and the temperature gradient can be is over an extent of about 0.5 to 2 cm. In certain embodiments, the three II-VI binary compounds can be CdS, CdSe, and ZnS; the temperature gradient is from about 675° C. to about 825° C.; and the temperature gradient can be is over an extent of about 1 cm in length.

In certain embodiments, the three II-VI binary compounds can be CdS, CdSe, and ZnS; the temperature gradient is from about 700° C. to about 825° C.; and the temperature gradient can be is over an extent of about 0.5 cm to 5 cm in length. In certain embodiments, the three II-VI binary compounds can be CdS, CdSe, and ZnS; the temperature gradient is from about 700° C. to about 825° C.; and the temperature gradient can be is over an extent of about 0.5 cm to 3 cm. In certain embodiments, the three II-VI binary compounds can be CdS, CdSe, and ZnS; the temperature gradient is from about 700° C. to about 825° C.; and the temperature gradient can be is over an extent of about 0.5 to 2 cm. In certain embodiments, the three II-VI binary compounds can be CdS, CdSe, and ZnS; the temperature gradient is from about 700° C. to about 825° C.; and the temperature gradient can be is over an extent of about 1 cm in length.

When the first and last positions define only a portion of a substrate surface, as discussed above, then the remaining portion thereof can be masked according to methods familiar to those skilled in the art to control the portion of the surface over which the II-VI alloy layer is formed.

In any of the preceding methods, the entire laterally varying II-VI alloy layer can be formed over the substrate in a single deposition step.

The variation in the composition of the II-VI layer as described above provides a II-VI layer which can absorb or emit light in within a bandgap range defined by the alloys at the first and last (e.g., second or third) positions defining the II-VI alloy layer. In certain embodiments, the II-VI alloy has a bandgap range of about 1.5 eV to 4.5 eV. Such bandgap ranges are useful for providing, for example, continuously tunable laser sources which can provide laser light having a wavelength between, for example, about 350 nm and 840 nm; or about 350 nm and 750 nm; or about 500 nm and 700 nm.

In another aspect, the invention provides $Zn_xCd_{1-x}S_ySe_{1-y}$ nanowires wherein x and y are each greater than or equal to 0 and less than or equal to 1. In certain embodiments, both x and y are greater than 0 and less than 1.

In certain embodiments, x is about 0.001 to about 0.97. In certain embodiments, x is about 0.005 to about 0.97.

In certain embodiments, y is about 0.10 to about 0.95. In certain embodiments, y is about 0.12 to about 0.95. In certain embodiments, y is about 0.14 to about 0.95. In certain embodiments, y is about 0.10 to about 0.92. In certain embodiments, y is about 0.12 to about 0.92. In certain embodiments, y is about 0.14 to about 0.92.

In certain embodiments, x is about 0.001 to about 0.97 and y is about 0.10 to about 0.95. In certain embodiments, x is about 0.001 to about 0.97 and y is about 0.12 to about 0.95. In certain embodiments, x is about 0.001 to about 0.97 and y is about 0.14 to about 0.95. In certain embodiments, x is about 0.001 to about 0.97 and y is about 0.10 to about 0.92. In certain embodiments, x is about 0.001 to about 0.97 and y is about 0.12 to about 0.92. In certain embodiments, x is about 0.001 to about 0.97 and y is about 0.14 to about 0.92.

In certain embodiments, x is about 0.005 to about 0.97 and y is about 0.10 to about 0.95. In certain embodiments, x is about 0.005 to about 0.97 and y is about 0.12 to about 0.95. In certain embodiments, x is about 0.005 to about 0.97 and y is about 0.14 to about 0.95. In certain embodiments, x is about 0.005 to about 0.97 and y is about 0.10 to about 0.92. In certain embodiments, x is about 0.005 to about 0.97 and y is about 0.12 to about 0.92. In certain embodiments, x is about 0.005 to about 0.97 and y is about 0.14 to about 0.92.

In another aspect, the $Zn_xCd_{1-x}S_ySe_{1-y}$ nanowires of any of the preceding embodiments can be prepared by a method comprising contacting at least a portion of a surface of a substrate within a reaction zone with a chemical vapor under suitable reaction conditions to form one or more $Zn_xCd_{1-x}S_ySe_{1-y}$ nanowires over the portion of the surface of the substrate, wherein the chemical vapor is generated by heating ZnS to a first temperature and CdSe to a second temperature that is less than the first temperature.

In certain embodiments, the surface comprises a catalyst coating, such as, but not limited to Au, Ga, Pb, Sn, or mixtures thereof. In certain embodiments, the surface comprises a catalyst coating comprising Au.

The first temperature, that is, the temperature at which the ZnS is heated can be about 980° C. to about 1080° C. In certain embodiments, the first temperature is about 960° C. to about 1060° C. In certain other embodiments, the first temperature is about 1050° C. The second temperature that is, the temperature at which the CdSe is heated can be about 960° C. to about 980° C. In certain embodiments, the second temperature is about 950° C. to about 980° C. In certain other embodiments, the second temperature is about 970° C.

In other embodiments, the chemical vapor can further comprise CdS generated by heating CdS to the second temperature.

The chemical vapor can have a pressure of about 40 torr to about 60 torr. In certain embodiments, the pressure can be about 40 torr to 70 torr. In certain embodiments, the pressure can be about 50 torr. However, other pressures can also be used, as is known to those skilled in the art.

The chemical vapor can have a flow rate of about 40 sccm to about 60 sccm. In certain embodiments, the flow rate can be about 45 sccm to 60 sccm. In certain embodiments, the flow rate can be about 50 sccm.

The chemical vapor can have a temperature less than the second temperature when contacting the substrate, for example, about 900° C. to about 940° C. In certain embodiments, the temperature of the chemical vapor when contacting the substrate can be about 920° C. to about 930° C. In certain embodiments, the temperature of the chemical vapor when contacting the substrate can be about 925° C.

In certain embodiments, the chemical vapor comprises a carrier gas, for example, Ar, Ne, He, $H_2$, or mixtures thereof. In one embodiment, the carrier gas is a mixture of Ar and $H_2$ (e.g., 5% $H_2$/Ar).

In certain embodiments the molar ratio of the at least two II-VI binary compounds can be selected to provide $Zn_xCd_{1-x}S_ySe_{1-y}$ nanowires having predetermined values of x and y. For example, the molar ratio of ZnS to CdSe can be about 1:2, to give, for example, $Zn_xCd_{1-x}S_ySe_{1-y}$ nanowires where x is about 0.45 and y is about 0.3.

In another aspect lasers are provided comprising a semiconductor structure or a $Zn_xCd_{1-x}S_ySe_{1-y}$ nanowire according to any one of the preceding aspects and embodiments thereof. In one embodiment, the laser has a continuously tunable emission wavelength between about 350 nm and 840 nm. In another embodiment, the laser has a continuously tunable emission wavelength between about 500 nm and 700 nm.

In another aspect are provided continuously tunable laser comprising a semiconductor structure according to any one of the preceding aspects and embodiments thereof, wherein the laser has a emission wavelength between about 350 nm and 840 nm. In another embodiment, the laser has a continuously tunable emission wavelength between about 500 nm and 700 nm.

In another aspect solar cells are provided comprising a semiconductor structure or a $Zn_xCd_{1-x}S_ySe_{1-y}$ nanowire according to any one of the preceding aspects and embodiments thereof. In one embodiment, the solar cell is a full-spectrum solar cell, e.g., full solar spectrum or full visible spectrum solar cell.

Figure 7:
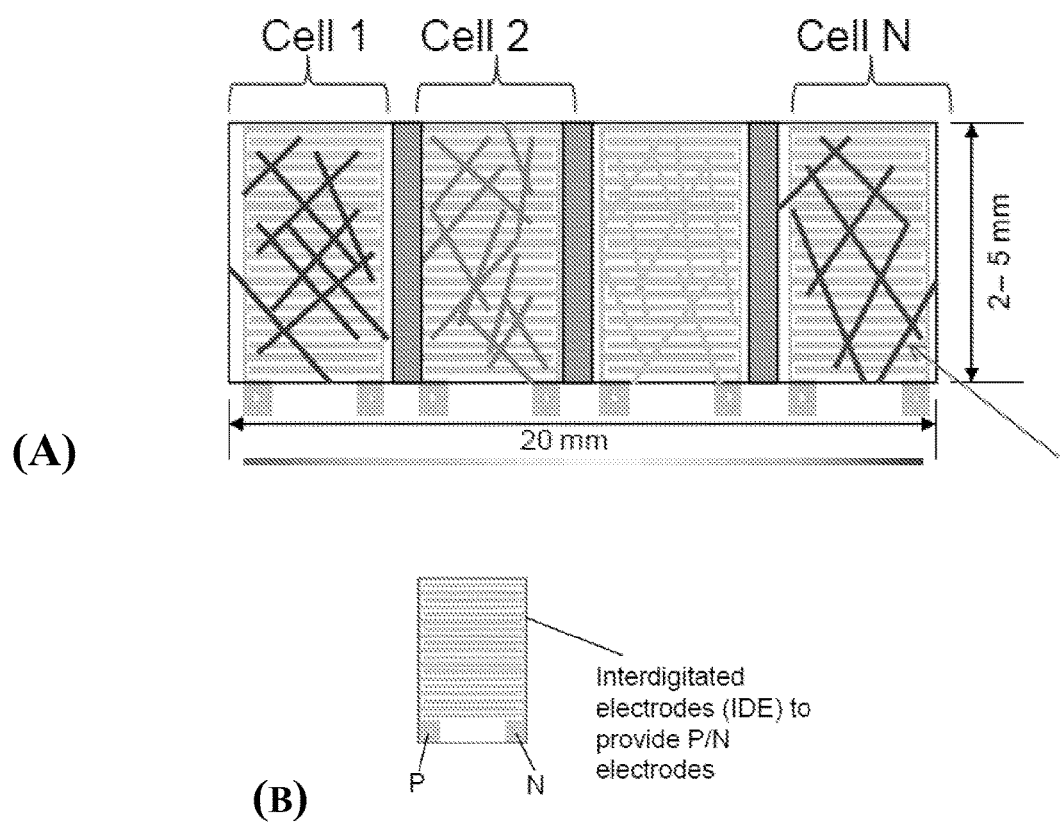
FIG. 7a show a device design to incorporate electrical contacts in communication with the laterally varying alloy layer formed on a substrate by contacting the substrate with interdigitated electrodes.
FIG. 7b illustrates a single interdigitated electrode having P and N contacts as utilized in FIG. 7a and Example 3.
Figure 8A:
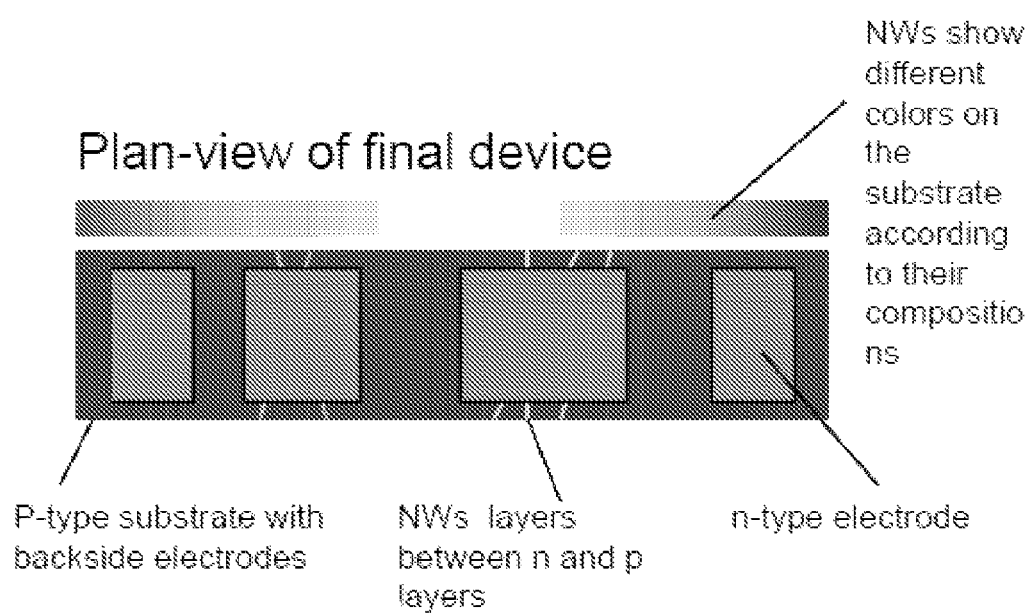
FIG. 8a shows a plan view of a second option for integrating electrical contacts with a laterally varying alloy layer formed on a substrate.
Figure 8B:
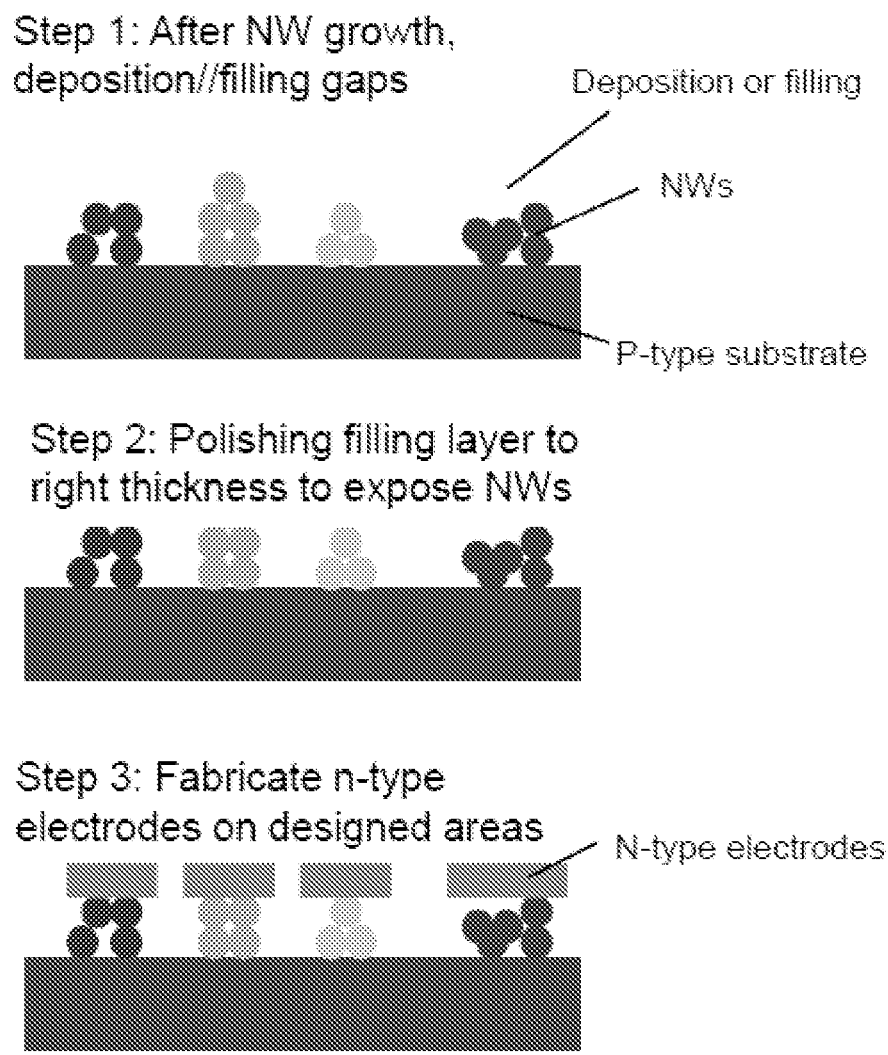
Figure 9:
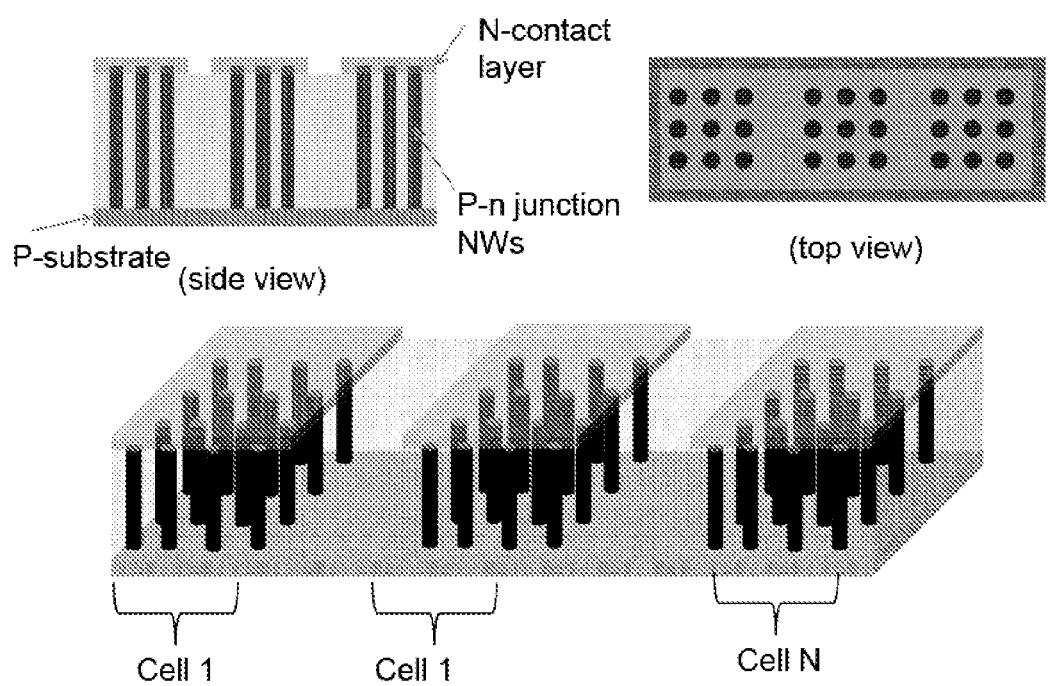
FIG. 9 shows a third option for integrating electrical contacts with a laterally varying alloy layer formed on a substrate, where the nanowires in the laterally varying alloy layer are grown vertically from the substrate surface.
Figure 18:
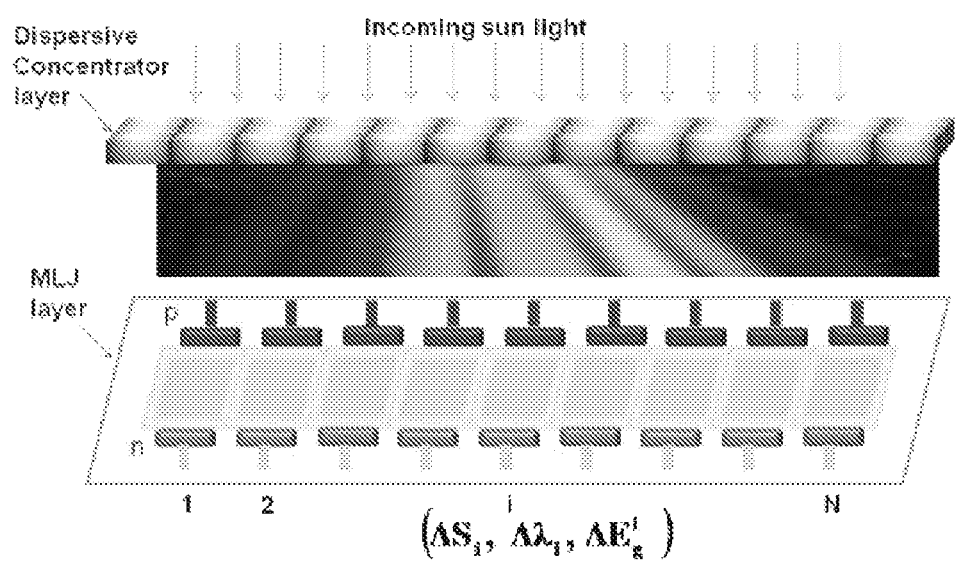
FIG. 18 is a schematic of the wavelength-specific lateral multijunction solar cells with N lateral junctions shown.
Figure 19:
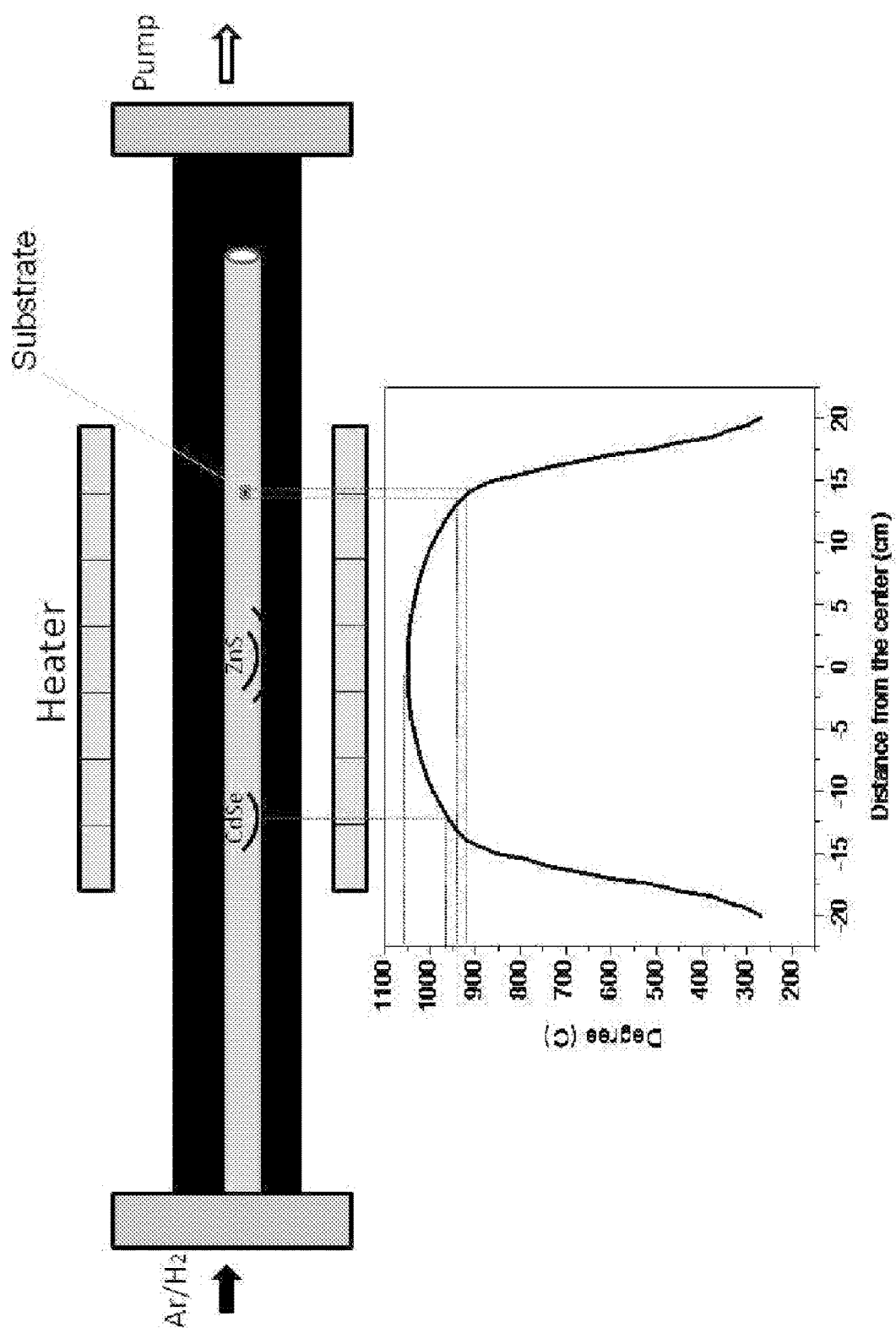
FIG. 19 shows a schematic of the reactor design used for preparing the spatially varying $Zn_xCd_{1-x}S_ySe_{1-y}$ alloy of Example 7.

In another aspect are provided solar cell devices where different wavelength bands of solar radiation are directed onto, and absorbed by, different cells of FIG. 7 (a), or FIG. 8 (a), FIG. 9, FIG. 18, or FIG. 19, with bandgap ranges related to the said wavelength bands.

DEFINITIONS

It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate.

It should be further understood that when a layer is referred to as being "directly on" or "directly over" another layer or substrate, the two layers are in direct contact with one another with no intervening layer. It should also be understood that when a layer is referred to as being "directly on" or "directly over" another layer or substrate, it may cover the entire layer or substrate, or a portion of the layer or substrate.

Herein, a notation is used to refer to alloys having the form of two sets of elements each within its own set of parenthesis; for example, (ABCD)(EFGH). This notation means that the alloy comprised at least one element selected from A, B, C, and D, and at least one element selected from E, F, G, and H. When this notation is used in combination with the modifiers such as "binary", "ternary", "quaternary", "quinary", or "senary", among others, it means that the alloy contains a total of 2, 3, 4, 5, or even 6 elements, respectively, provided that at least one element selected from A, B, C, and D, and at least one element selected from E, F, G, and H. For example, a tertiary (CdZnHg)(SSeTe) alloy includes both CdSSe and CdHgS, among other combinations.

The term "II-VI alloy" as used herein means an alloy where the constituent elements are selected from Groups IIA, IIB, and VIA, of the periodic table, wherein at least one constituent element is selected from Groups IIA and/or IIB of the periodic table and at least one constituent element is selected from Group VIA of the periodic table. Examples of II-VI alloys include, but are not limited to (a) binary II-VI compounds (i.e., "II-VI compounds") such as, but not limited to, Cadmium selenide (CdSe), Cadmium sulfide (CdS), Cadmium telluride (CdTe), Zinc oxide (ZnO), Zinc selenide (ZnSe), Zinc sulfide (ZnS), and Zinc telluride (ZnTe); (b) ternary alloy such as, but not limited to, Cadmium zinc telluride (CdZnTe, CZT), Mercury cadmium telluride (HgCdTe), Mercury zinc telluride (HgZnTe), and Mercury zinc selenide (HgZnSe); and (c) quaternary alloys such as, but not limited to, Cadmium mercury selenide telluride (CdHgSeTe) and Cadmium zinc selenide telluride (CdZnSeTe).

The term "layer" as used herein, means a region of a material, typically grown on a substrate, (e.g., an II-VI semiconductor) that can be uniformly or non-uniformly doped and that can have a uniform or a non-uniform composition across the region.

The term "p-doped" as used herein means atoms have been added to the material to increase the number of free positive charge carriers.

The term "n-doped" as used herein means atoms have been added to the material to increase the number of free negative charge carriers.

The term "lateral" with respect to a surface, as used herein, refers to a direction essentially parallel to the surface.

The term "nanowire" as used herein means structures that have a lateral size of less than about 1000 nm (e.g., about 1-100 nm) and an unconstrained longitudinal size. For example, nanowires can have an aspect ratio of 1000 or more.

EXAMPLES

Example 1

Growth of $CdS_xSe_{1-x}$ Alloy Nanowires

Figure 5:
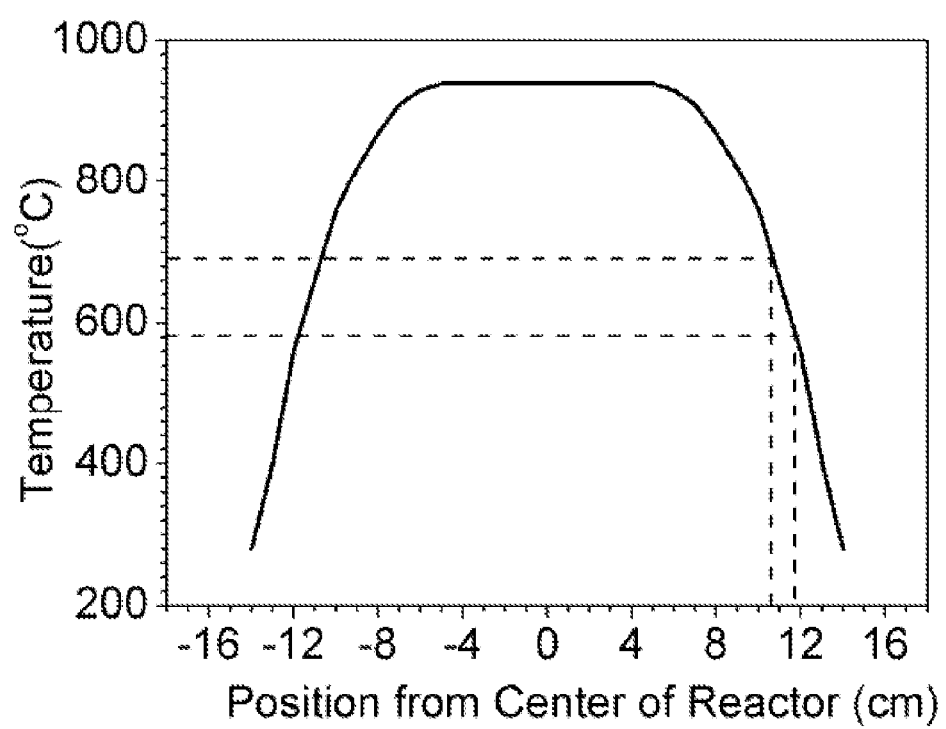
FIG. 5 is a graph showing a typical measured temperature profile along the furnace axis for the nanowire growth. Dotted lines indicate the temperature and space intervals for optimized sample growth.

To demonstrate such widely-spatially-tunable lasing, we chose the ternary alloy $CdS_xSe_{1-x}$ (CdSSe) in the full composition range between CdS (x=1, bandgap 2.44 eV) and CdSe (x=0, bandgap 1.72 eV), because they are two important compound semiconductors that are of great interest for their emission in the visible wavelength range and have been investigated for their 1D nanostructures and alloys recently (see, Pan et al., *J. Am. Chem. Soc.* 127, 15692-1569 (2005); Pan et al., *Nanotech.* 17, 1083-1086 (2006); Agarwal et al., *Nano Lett.* 5, 917-920 (2005); Yu et al., *J. Am. Chem. Soc.* 125, 16168-16169 (2003); Barrelet et al., *Nano Lett.* 4, 1981-1985 (2004); Ma et al., *Nano Lett.* 7, 3300-3304 (2007)). For example, CdSSe alloy nanowires with several compositions were grown by changing the ratio of the source powders (CdS and CdSe) and/or the growth temperature of the substrate (see, Pan, 2005, supra; and Pan, 2006, supra). To grow CdSSe nanowires in the full range of alloy composition on a single substrate in a single run of growth, comprehensive optimization involving substrate locations, flux rates of semiconductor vapors, and, most importantly, control of the temperature gradient is necessary. More specifically, for a given combination of flux rates and location and length of the substrate, a large enough temperature gradient is required and the range of temperature on the substrate must be appropriate to grow the full alloy composition range of CdSSe nanowires simultaneously in a spatially-correlated fashion. For this purpose, we have specially designed a short tube furnace with a very short central heating zone and with the ends of the furnace equipped with an efficient cooling mechanism during the growth of sample. With this setup, we could achieve a very large temperature gradient in a short spatial interval of about 1 cm along the tube axis with a temperature variation between about 580° C. and about 690° C. (see the temperature profile, FIG. 5), which simultaneously covers the full temperature range required to grow the complete composition range of CdSSe in a single run of growth.

The experimental growth of CdSSe nanowires with spatially graded alloy compositions on a single substrate of about 1 cm in length were conducted by physical evaporation in the presence of Au particles as a catalyst. A 0.2 g mixture of CdS and CdSe powders (Alfa Aesar, Ward Hill, Mass., 99.995% purity; mole ratio 1:1) was placed onto a ceramic plate at the center of a quartz tube (1 inch in diameter) inside a small horizontal tube furnace equipped with cooling systems at both ends. A substrate (glass, silicon, or silicon dioxide) of about 1 cm in length, coated with a 1 nm Au film, was placed downstream of the gas flow, about 3 cm from the center of the source-material-carrying ceramic plate. Prior to heating, high-purity He was introduced into the quartz tube with a constant flowing rate (200 sccm) to purge the $O_2$ inside. After 100 min, the flow rate was adjusted to 50 sccm and the furnace was rapidly heated to 1000° C. in the middle section and maintained at this temperature for 60 min. Bright green to black products were deposited on the substrate downstream where the deposition temperature was in the range of about 580 to about 690° C.

Example 2

Layer Characterization

1. Photoluminescence:

The lasing characteristics of the CdSSe sample of Example 1 was studied using a pulsed (6 ns, 10 Hz), frequency-quadrupled Nd:YAG laser (Spectra Physics Quanta Ray, at 266 nm) as the pump source. The pump beam was focused by a 250 mm focal length lens to a spot size of about 300 μm on the sample at an incidence angle of about 43°. Luminescence from the sample was then collected by a Mitutoyo Objective lens (Plan APO, SL, 50×), placed normal to the sample. The collected light was directed to a 0.3 m spectrometer and detected with a liquid nitrogen cooled CCD detector. The spatial resolution and spectral resolution were estimated to be about 700 nm and 0.2 nm, respectively. For the low temperature measurement, the sample was placed in a microscope cryostat. Liquid nitrogen was used to cool the samples to 77 K. For both the room-temperature and the low-temperature measurements, the sample was scanned across the length of the substrate to measure the light emission at different points on the substrate.

Figure 1:
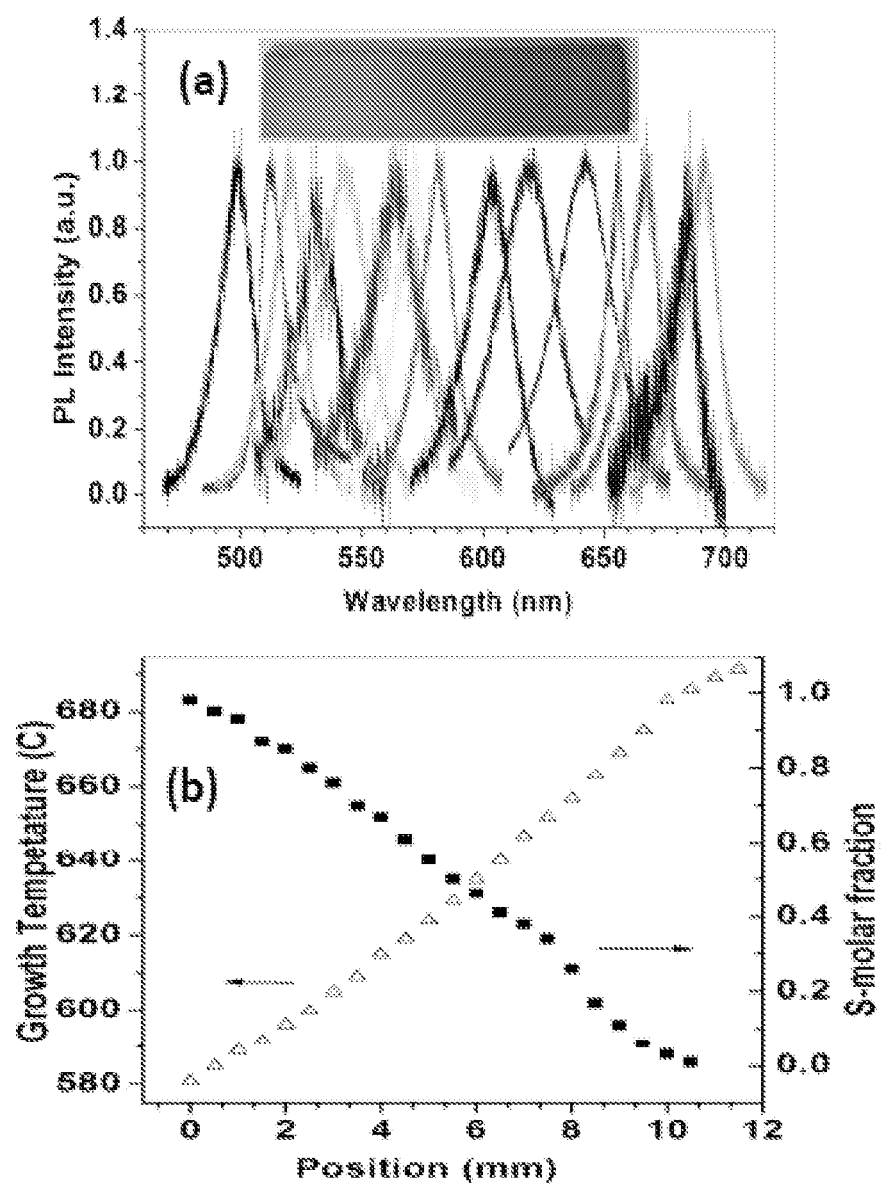
FIG. 1(a) shows microscope photoluminescence (PL) spectra collected at different locations along the substrate length at cryostat temperature of 77 K.
FIG. 1(b) shows substrate temperature (left coordinate) and S-molar fraction (right coordinate, extracted from the EDS measurement shown in FIG. 6) measured at different points along the substrate length.

FIG. 1(a) shows the representative photoluminescence (PL) spectra at T=77 K of spatially composition-graded CdSSe nanowires, and the inset shows a real-color photograph of a SiO2-substrate with such nanowires. The photograph clearly shows the color change from light-yellow to black along the sample length direction. The micro-PL spectral taken at 15 different points along the length of the substrate show no mid-gap emission band, indicating high-quality single crystal nanowires with negligible surface states, consistent with TEM measurements of the crystal structure (not shown). The PL peaks vary between 498 nm and 692 nm, covering a large part of the visible spectrum.

2. Scanning Electron Microscopy (SEM) and Energy Dispersive X-Ray Spectroscopy (EDS):

SEM images and the in-situ EDS analysis were performed using a Philips XL-30 field-emission SEM equipped with an energy-dispersive X-ray detector. To determine the elemental composition at each point on the sample, the substrate was accurately positioned using an encoded x-y translation stage, and the locations were recorded. The background-subtracted Cd (L), Se (L) and S (K) lines were analyzed using the standard-less quantification mode of the energy-dispersive X-ray analysis software.

Figure 2:
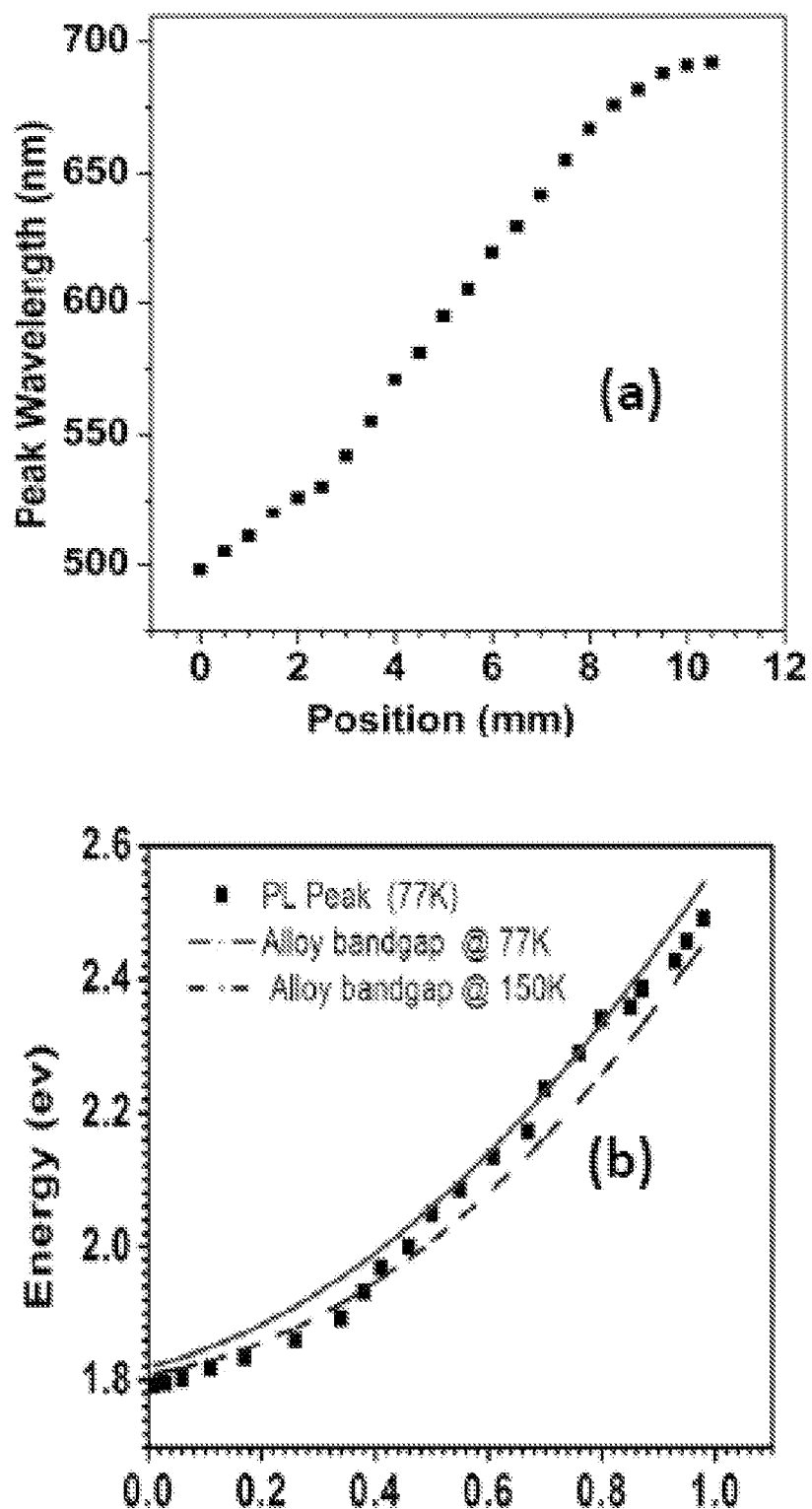
FIG. 2(a) is a graph illustrating PL peak wavelengths as a function of substrate length coordinate.
FIG. 2(b) is a graph illustrating the bandgap of the alloy (lines) obtained from equation (1) or PL peak energy (squares) as a function of alloy composition determined from the EDS data shown in FIG. 1(b).
Figure 6:
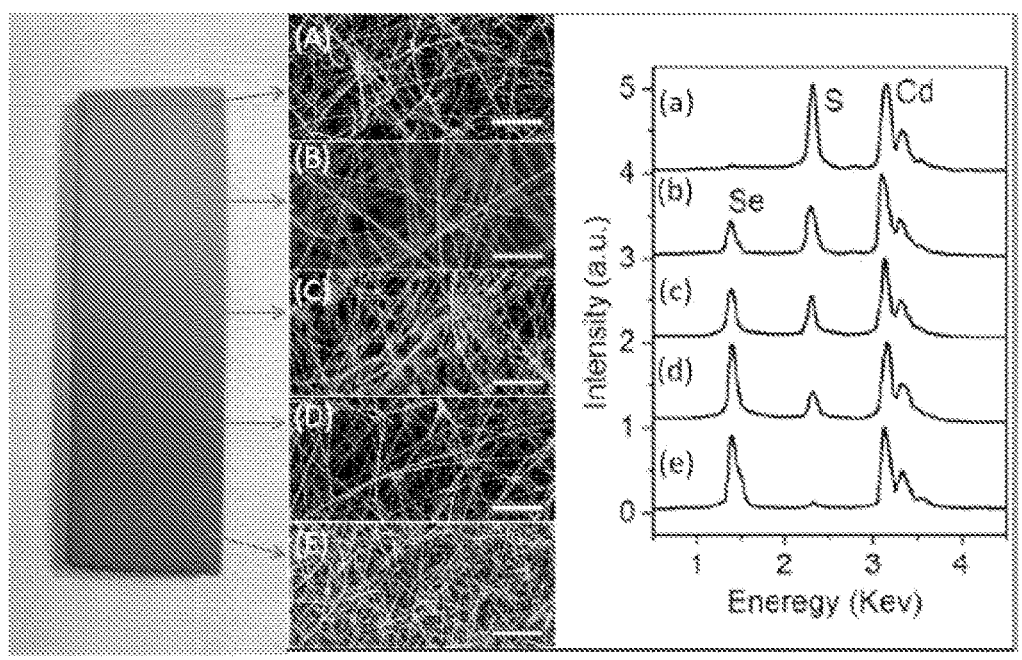
FIG. 6 shows, in the left panel, Selected Scanning Electron Microscopy (SEM) images collected at five different locations from the left end to the right end of the nanowire-covered substrate (marked as (a), (b), (c), (d), (e), respectively; and in the right panel, in-situ energy dispersive X-ray spectra (EDS) at the same five locations showing the corresponding alloy compositions.

To associate different PL peaks at different locations of the substrate to the growth temperature and the local alloy composition, we plot in FIG. 1(b) measured substrate temperature and S-molar fraction extracted from the energy dispersive X-ray diffraction spectroscopy (EDS) measurements (see, FIG. 6 for the actual spatially-resolved EDS measurements). The Se fraction is complimentary to that of S. A more refined spatial map of the PL peak is shown in FIG. 2(a). Knowing the spatial dependence of the alloy composition and that of the PL wavelength at the same time, we can readily relate the alloy composition to the PL peak directly. In FIG. 2(b), we plot the PL peak as a function of the S-molar fraction (filled squares). Furthermore, it is known that bandgap of a ternary alloy is determined by an interpolation between those of the two binaries with additional nonlinear bowing:

$$E_g(AB_xC_{1-x})=xE_g(AB)+(1-x)E(AC)-x(1-x)b \quad (1)$$

For $CdSe_xS_{1-x}$ the bandgap bowing parameter b=0.54 according to ref 21. Using the alloy composition determined by EDS as shown in FIG. 1(b), we can obtain bandgap for each molar fraction by using equation (1). The resulting bandgap with composition at T=77 K is plotted as solid line in FIG. 2(b). We see that there is a good overall agreement between the PL peak energy and the bandgap at each given molar fraction. To get an idea of the possible laser-induced temperature rise, we also plotted the bandgap at a higher temperature (T=150 K, as represented by the dashed line), which is apparently higher than the actual temperature of nanowires. From this comparison, it is clear that we have achieved a quasi-continuous change of alloy compositions by using the temperature gradient and that such continuous alloy grading leads to a spatial-grading of the wavelength of emitted light over a wide wavelength range.

Figure 3:
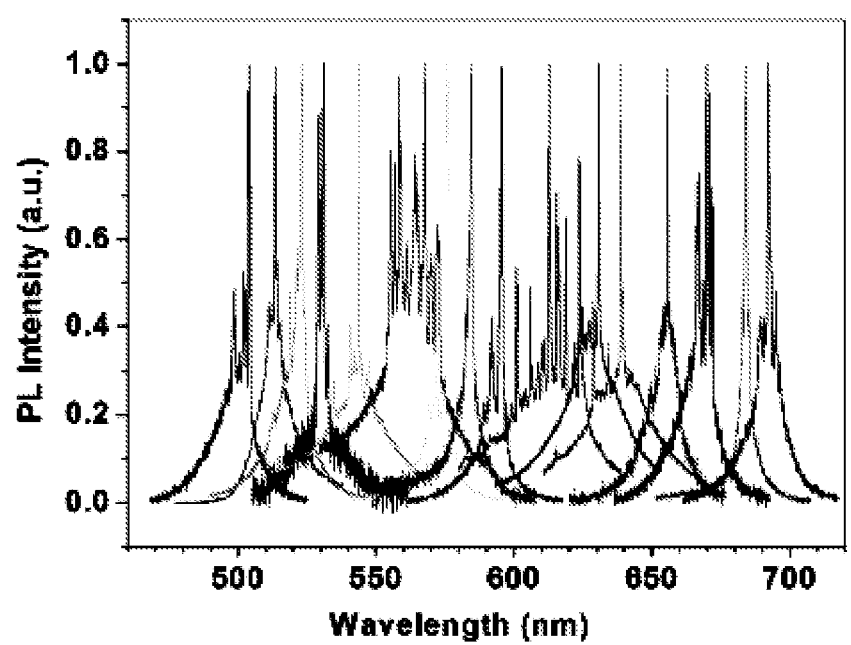
FIG. 3 shows micro PL collected at various locations along the substrate maintained at 77 K under high optical pumping condition showing lasing or multimode lasing.
Figure 4:
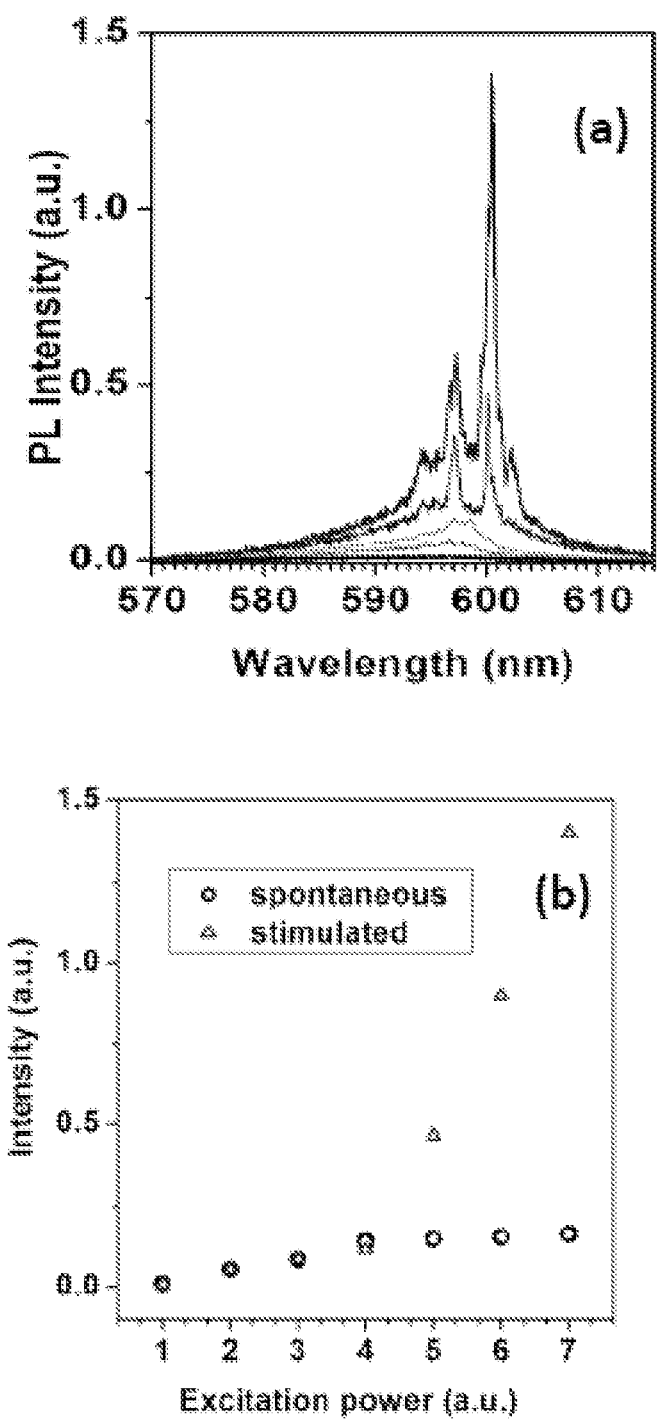
FIG. 4(a) shows the evolution of the PL spectrum from spontaneous emission to lasing as pumping is increased.
FIG. 4(b) shows PL intensity at lasing wavelength (triangles) and at a non-lasing wavelength of 592 nm (circles).

3. Lasing:

To demonstrate the possibility of widely-tunable lasing, we performed similar micro-PL measurements to that described above, but with increased laser-excitation intensity. FIG. 3 shows results of this experiment where PL spectra from 16 spots along the length of the substrate maintained at 77 K. We see that extremely sharp lines now emerge from the broad spontaneous emission background at every spot. Compared to the PL spectra shown in FIG. 1(a), we see clearly lasing has occurred at each point with some of the spots showing multimode lasing. The mechanism of lasing is similar to what has been reported widely in semiconductor nanowires where individual wires can act as laser cavities (see, Johnson et al., *J. Phys. Chem. B.* 105, 11387-11390 (2001); Duan et al., *Nature* 421, 241-245 (2003); Chin et al., *Appl. Phys. Lett.* 88, 163115 (2006); Maslov et al., *Appl. Phys. Lett.* 83, 1237-1239 (2003); Maslov et al., *IEEE J. Quant. Elect.* 40, 1389-1397 (2004)). The lasing wavelength range is measured from 503 nm to 692 nm. We emphasize that this is the first demonstration of spatially tunable semiconductor nanowire lasers with wide-wavelength coverage, to the best of our knowledge. The wavelength coverage of $\Delta\lambda=189$ nm is the widest ever reported for any semiconductor material. Achieving this relative tunability of $\Delta\lambda/\lambda=32\%$ on a single as-grown substrate of about 1 cm is even more remarkable. FIG. 4(a) shows a sequence of PL spectra collected at the same spot with increasing pump intensity levels to show the detailed transition process from spontaneous emission to lasing. We again see a clear transition from broadband emission to sharp lasing peaks. The multiple peaks could be either from multiple modes of a single nanowire or from different nanowires with different lengths. To see the same laser transition from a different perspective, we plot in FIG. 4(b) light intensity collected at two fixed wavelengths as a function of pumping intensity. One wavelength is where laser peak eventually appears, showing a transition from spontaneous emission to lasing, and the other wavelength (592 nm) is outside of the peak region, reflecting how spontaneous emission changes with pumping around laser threshold. As expected of a typical laser threshold, spontaneous emission starts to saturate at a pumping level where lasing wavelength shows a clear transition. After the transition, the spontaneous emission maintains at a saturated level, with slight increase due to laser-induced heating by the excitation laser, while the lasing mode increases its intensity linearly with the intensity of the excitation laser.

In summary, we have demonstrated an unprecedented semiconductor laser chip with the widest wavelength span ever, continuously tunable over the length of the chip. Such a multiwavelength laser chip can be used for a wide-variety of applications, such as an on-chip wavelength division multiplexing (WDM) source, a multi-wavelength sensor, an optimizable white-light source, an RGB display, and nanophotonics integrated circuits. The unique widely-bandgap-graded nanomaterials can also be of great potential use as a material base for full-spectral-coverage solar cells or for a spectrometer on-a-chip. The results reported here open the way for many exciting applications of this new class of nanomaterials.

Example 3

Device Integration

The substrate of Example 1 can be integrated with electrical contacts according to at least the following methods, for example, to yield structures suitable for use as solar cells. A first integration method is illustrated in FIG. 7a. A catalyst is patterned to provide a lateral array of minicells (Cell 1, Cell 2 . . . Cell N) on the surface of an insulating substrate. The substrate can have dimensions, for example, of about 2-5 mm×20 mm or larger, where the minicells are laterally arranged along the long dimension (20 mm) of the substrate. The extent of each minicell can be selected to yield a given bandgap interval for each minicell. Nanowires can be deposited on the patterned insulating substrate according to the methods of Example 1, where the nanowires deposit on the portions of the substrate having a surface catalyst layer. In FIG. 7a, the mean bandgap of each minicell continuously increases from Cell 1 through Cell N (i.e., left to right). Finally, an interdigitated electrode (having P and N contacts as illustrated in FIG. 7b) may be placed in contact with each minicell and the assembly hot-pressed to form a contact (i.e., electrical communication) between the electrodes and the nanowires. The metal electrodes can also be deposited directly on top of the nanowires after the growth of the wires.

One straightforward approach is to use interdigitated electrodes on the backside of the solar cells. Another approach is to use top transparent and bottom contacts for each lateral junction. This design has advantages of easy and inexpensive growth on amorphous substrates without pattering. But the obvious drawback is the poor contacts due to the lack of high doped contact regions for electrode fabrication. The interdigitated back electrodes were previously used for amorphous silicon solar cells (see, Green and Wenham, *Appl. Phys. Lett.*, 65, 1994, 2907).

A second integration method is illustrated in FIG. 8*a*. A catalyst is patterned to provide laterally oriented minicells (Cell 1, Cell 2 . . . Cell N) on the surface of a p-type substrate. The substrate can have dimensions, for example, of about 2-5 mm×20 mm, where the minicells are laterally oriented along the long dimension (20 mm) of the substrate. The extent of each minicell can be selected to yield a given bandgap interval for each minicell. Nanowires can be deposited on the patterned insulating substrate according to the methods of Example 1, where the nanowires deposit horizontally on the portions of the substrate having a surface catalyst layer. In FIG. 8*a*, the median bandgap of each minicell continuously increases from Cell 1 through Cell N (i.e., left to right). The nanowires are planarized by depositing a $SiO_2$ layer over the nanowires (FIG. 8*b*, Step 1) followed by polishing to expose the nanowires at the surface (FIG. 8*b*, Step 2). Finally, n-type electrodes are deposited over designated areas of each minicell, according to methods familiar to those skilled in the art, for example, evaporation or chemical vapor deposition (FIG. 8*b*, Step 3).

A third integration method is illustrated in FIG. 9. A catalyst is patterned to provide laterally oriented minicells (Cell 1, Cell 2 . . . Cell N) on the surface of a p-type substrate. Nanowires are grown vertically from the surface within each minicell (FIG. 9, top left). The substrate can have dimensions, for example, of about 2-5 mm×20 mm, where the minicells are laterally oriented along the long dimension (20 mm) of the substrate. The extent of each minicell can be selected to yield a given bandgap interval for each minicell. Nanowires can be deposited on the patterned insulating substrate according to the methods of Example 1, where the nanowires deposit on the portions of the substrate having a surface catalyst layer. In FIG. 9, the median bandgap of each minicell continuously increases from Cell 1 through Cell N (i.e., left to right, FIG. 9, bottom). The nanowires are planarized by depositing a $SiO_2$ layer over the nanowires followed by polishing to expose the tops of the nanowires at the surface. Finally, n-type electrodes are deposited over designated areas of each minicell, according to methods familiar to those skilled in the art, for example, evaporation or chemical vapor deposition to yield the organized structures illustrated in FIG. 9.

The device integration examples shown in FIGS. 7-9 can be similarly adopted for multispectral applications. In this case, each cell can be separately biased properly to collect electrical current for that cell corresponding to a specific color.

Example 4

Alloy with Laterally Varying CdSSe and CdZnS Alloy Portions

Figure 10:
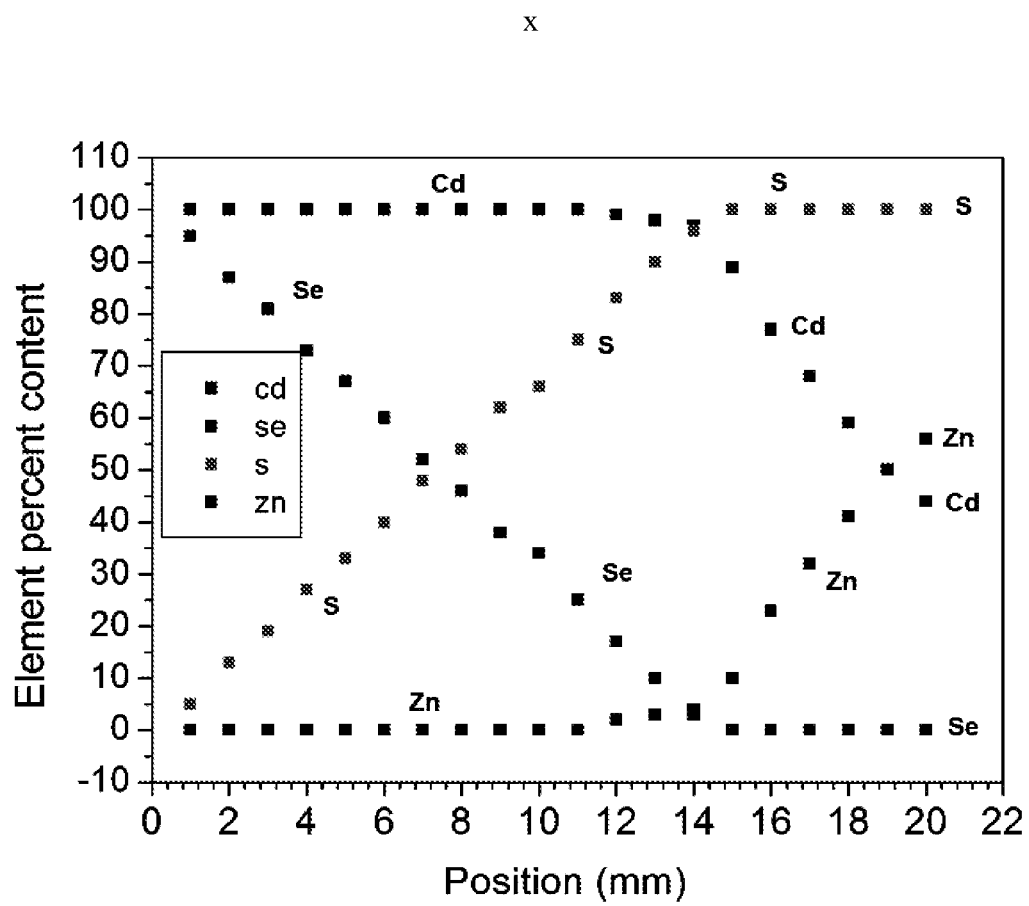
FIG. 10 shows SEM spatial elemental profiling of a spatially varying II-VI alloy as a function of position along a substrate surface.
Figure 11A:
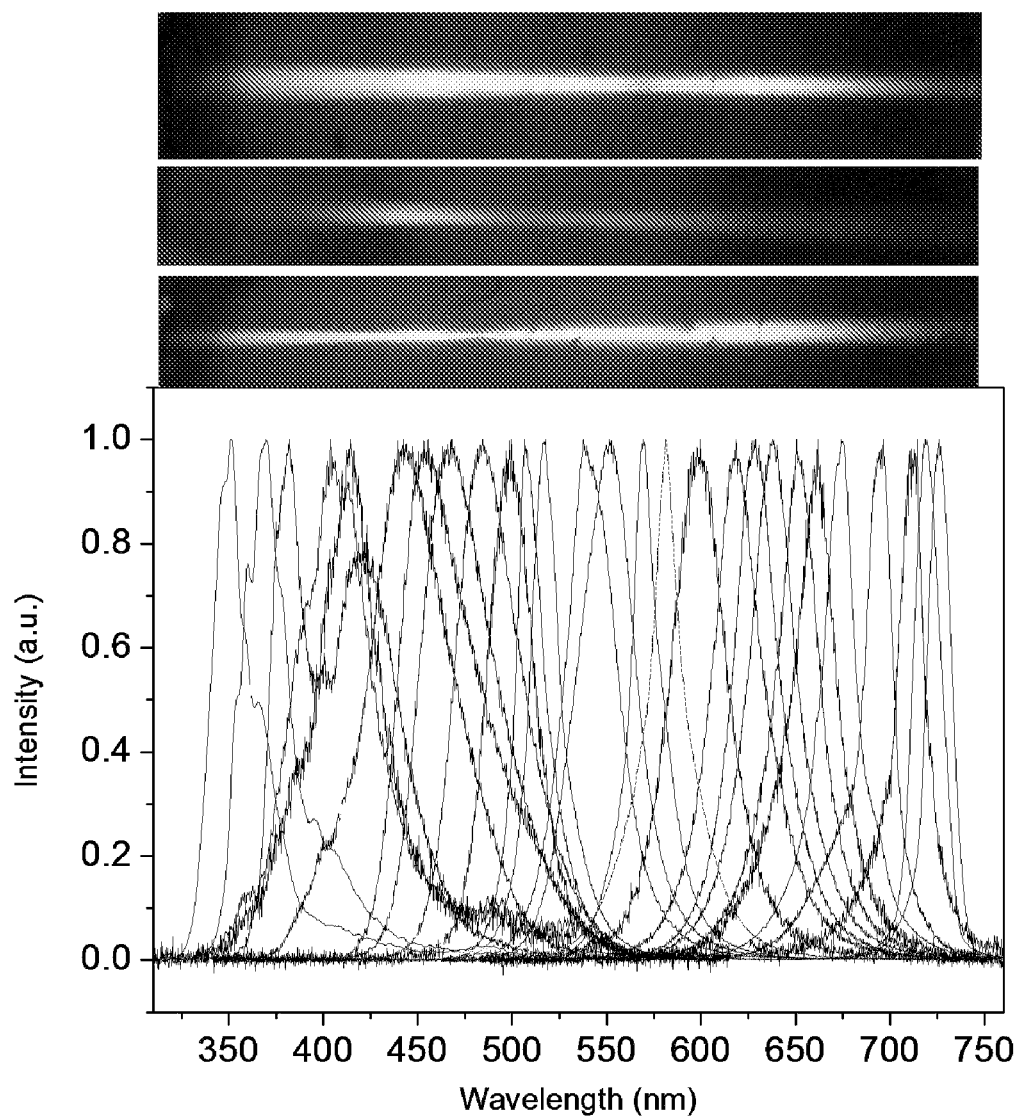
FIG. 11a shows (top) an image of the emission produced by preceding substrate excited along its length; and (bottom) normalized emission spectra measured along the length of the same substrate.

In another example, an alloy comprising two different ternary alloys is prepared having two laterally varying portions as illustrated in FIG. 10. FIG. 10 shows SEM spatial elemental profiling of the alloy as a function of position along the substrate surface. In a first portion, the alloy comprises $CdS_xSe_{1-x}$ (CdSSe) in the full composition range between CdS (14 mm Position, bandgap 2.44 eV) and CdSe (0 mm Position, bandgap 1.72 eV). In a second portion from 14 mm Position to 20 mm position, the alloy comprises $Cd_{1-x}Zn_xS$ in the composition range between x=0 (at 14 mm) to x=0.60 (at 20 mm). Such alloys comprising Zn in the second portion greatly increases the bandgap range covered by the nanowire alloy layer. In the present example, more than the entire visible spectrum has been covered from about 350 nm to about 750 nm, as measured by emission spectra taken as a function of lateral displacement along the length of the substrate described above. FIG. 11*a* shows, at the top, an image of the emission produced by preceding substrate excited along its length (20 mm); the bottom of FIG. 11*a* shows the normalized emission spectra measured along the length of the same substrate.

Figure 11B:
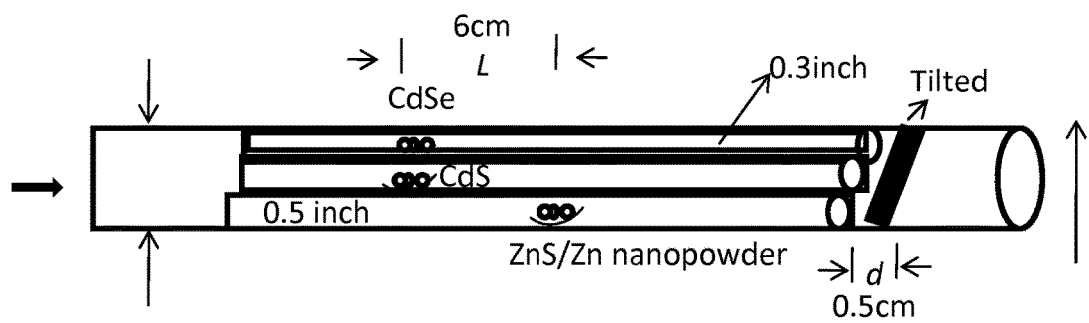
FIG. 11b shows a schematic of the reactor design used for preparing the spatially varying II-VI alloy of FIG. 10 and Example 4.

The experimental growth of $CdS_xSe_{1-x}$ and $Cd_{1-y}Zn_yS$ nanowires with spatially graded alloy compositions on a single substrate of about 2 cm in length are conducted by physical evaporation in the presence of Au particles as a catalyst. CdS, CdSe, and ZnS/Zn powders are each placed onto individual ceramic plates, each at the center of individual quartz tubes inside a small horizontal tube furnace equipped with cooling systems at both ends. As shown in FIG. 11*b*, CdSe is placed with a tube having an internal diameter of 0.3 in. while the remaining powders are each placed in tubes having an internal diameter of 0.5 in. A substrate (glass, silicon, or silicon dioxide) of about 2 cm in length, coated with a 1 nm Au film, was placed 0.5 cm downstream of the gas flow and tilted to provide a temperature gradient across the surface of the substrate. Prior to heating, high-purity He is introduced into the quartz tube with a constant flowing rate (200 sccm) to purge the $O_2$ inside. After 100 min, the flow rate is adjusted to 50 sccm and the furnace is rapidly heated to 1000° C. in the middle section and maintained at this temperature for 60 min. Products were deposited on the substrate downstream where the deposition temperature was in the range of about 580° C. to about 690° C.

Example 5

Chemical Vapor Deposition of Continuous Spatial Composition-Graded Single Crystal $Zn_xCd_{1-x}S_ySe_{1-y}$ Alloy Nanowires Quaternary ZnCdSSe nanowires with spatial graded alloy compositions on a single substrate was conducted in a horizontal chemical vapor deposition (CVD) system where source materials (ZnS and CdSe powders) are loaded in two mini-tubes (see, Kuykendall et al, *Nature Materials* 6, 2007, 951) arranged in a carefully designed spatial configuration to achieve spatial alloy grading. This spatial configuration and the additional temperature profiling (see, Pan et al, *Nano Letters*, 9, 2009, 784) across the substrate allow us to achieve desired spatial alloy composition grading. Specifically, two ¼"-diameter "quartz mini-tubes were placed horizontally inside a 1"-diameter quartz tube for transporting the reaction reagents independently to the reaction zone. Before growth, some amount of high-purity ZnS and CdSe source powders (Alfa Aesar, 99.995%) were loaded inside each of the mini-tubes. ZnS powder was positioned at the center of the furnace, while CdSe powder was placed upstream and 10 cm from the center of the furnace. A piece of quartz (0.5×2 cm in size) pre-sputtered with 2 nm Au film was positioned downstream facing the ends of the mini-tubes. The substrate was tilted into a proper angle making its two ends have different distances from the center of the large tube reactor. The distance from the substrate to the two mini-tube ends are both maintained at about 3 mm. The two ends of the tilted substrate are 15.6 (low-temperature end, near to the mini-tube for CdSe) and 14.2 mm (high-temperature end, near to the mini-tube for ZnS) from the center of the furnace, respectively. This tilting leads to a controlled temperature gradient on the substrate. The tube reactor was evacuated and back-flushed with $Ar/H_2$-5% gas until the desired pressure of 5 torr was reached. A constant flow of 50 sccm was used during growth. The temperature at the furnace center was set to 960° C. with a heating rate of 40° C./min, and maintained at its peak temperature for 2 min. After the growth, the furnace was naturally cooled to room temperature. The temperature at the two ends of the substrate was measured as 700° C. and 815° C., respectively. The temperature of the locations where ZnS and CdSe powder loaded is 960° C. and 900° C., respectively.

Figure 14:
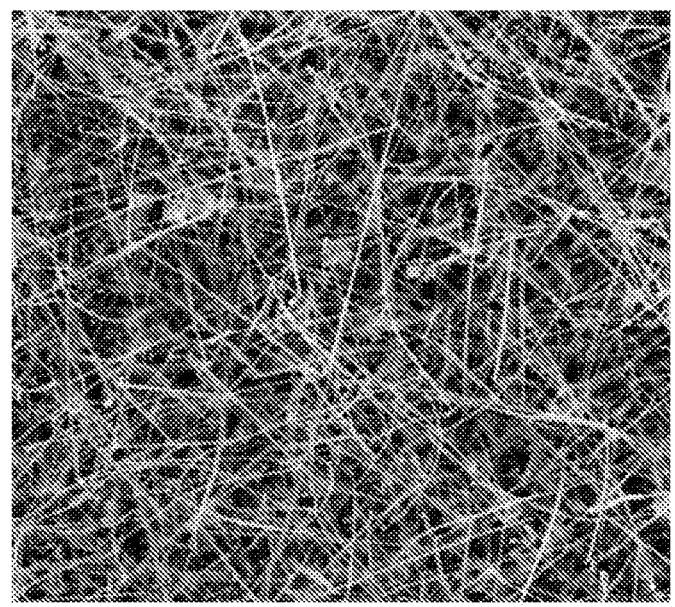
FIG. 14a is a SEM micrograph of the composition graded nanowires of Example 5 after growth.
FIG. 14b shows element profiles along the length of the nanowire substrate of Example 5.
Figure 14:
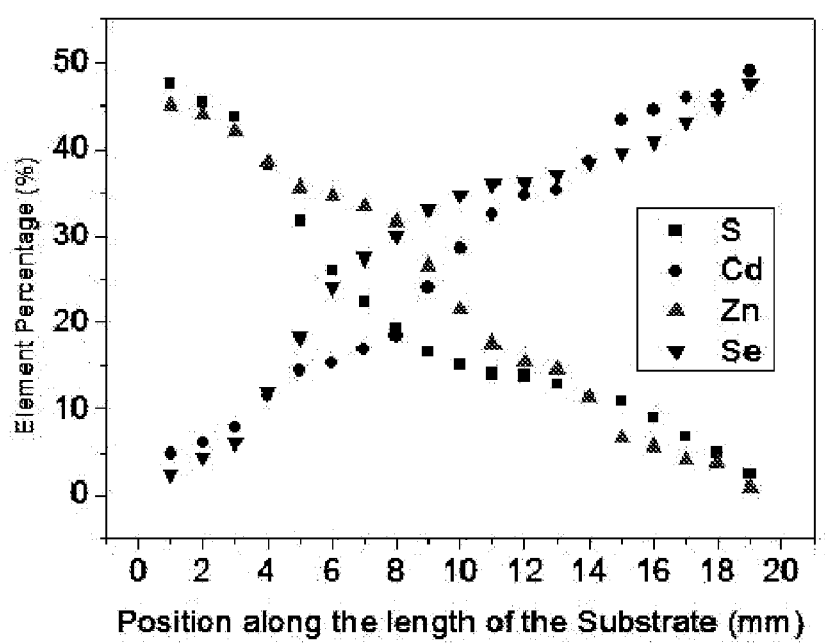

FIG. 14a shows a typical scanning electron microscopy (SEM) images of the surface of the substrate after growth. The SEM micrograph indicates that most of the substrate is covered by nanowires with diameters of 100 nm-200 nm, and lengths of several tens of microns. The high-resolution TEM (HRTEM) results of singles wires (not shown here) indicate the single-crystal nature and wurtzite hexagonal structure of these quaternary alloy wires. FIG. 14b is the element profiles along the length of the achieved quaternary composition grading, collected using the energy dispersive X-ray spectroscopy (EDS) equipped in SEM. The result shows that all the detected regions along the length of the grading are composed of elements Zn, Cd, S and Se, and that the Zn and S fractions are complementary to that of Cd and Se, respectively.

Figure 15:
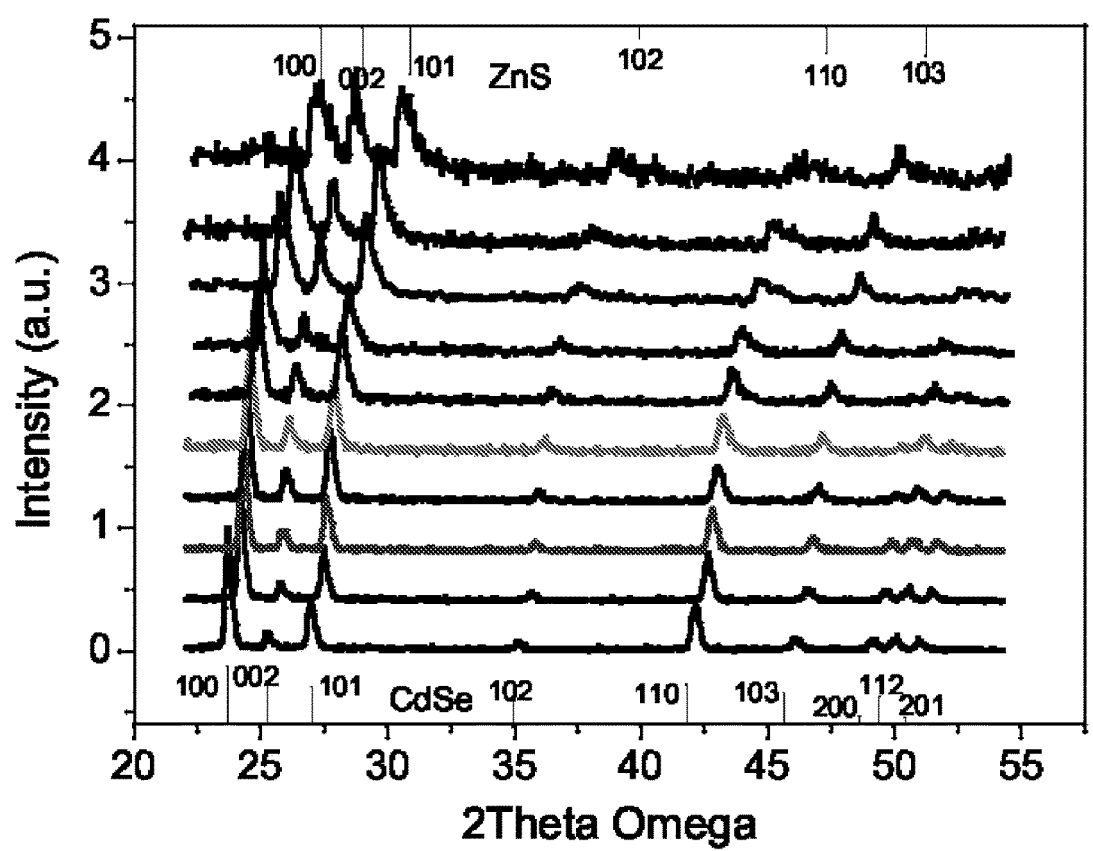
FIG. 15 shows position-dependent XRD spectra, different curves representing XRD taken from various points along the length of the composition graded sample of Example 5 with a scanning step of 2 mm.

The crystal quality/structure across the overall length of the as-grown spatially composition-graded alloys was investigated by small-area X-ray diffraction (XRD) measurements. FIG. 15 shows the position-dependent XRD profiles along the length of the sample with a scanning step of 2 mm. The standard 2-theta values for ZnS and CdSe wurtzite single crystals are also shown for comparison. The XRD results show that all the detected regions are materials with wurtzite hexagonal crystal structure. The diffraction peaks shift gradually from the ZnS-rich end to the CdSe-rich end towards smaller angles, indicating the formation of alloys with intermediate compositions with their lattice constants gradually increased.

Figure 16:
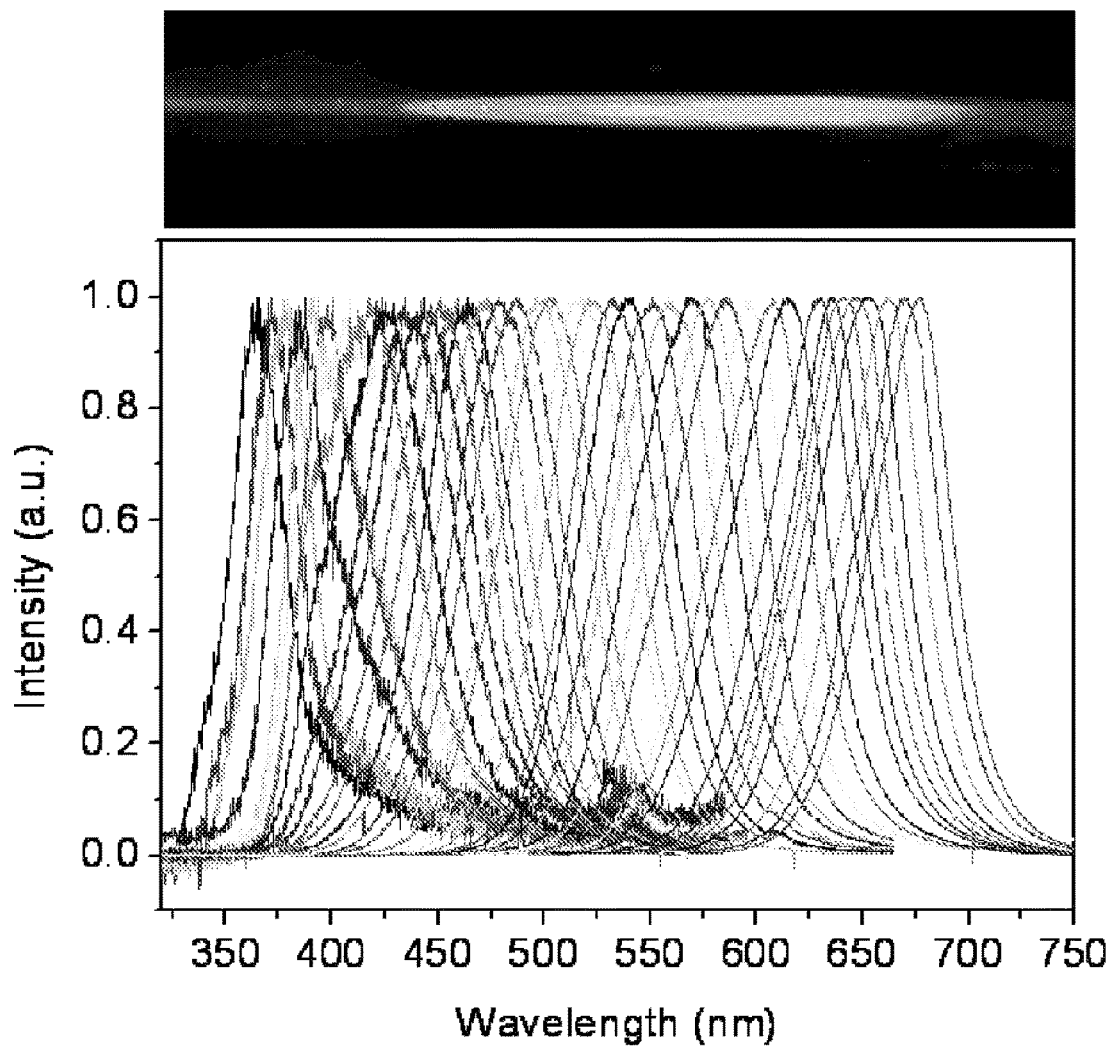
FIG. 16 shows the nanowire sample of Example 5 (2 cm long) (top); and photoluminescence spectra measured at various locations along the length of the sample of Example 5 (bottom) with each curve representing measurement at one location.
Figure 17:
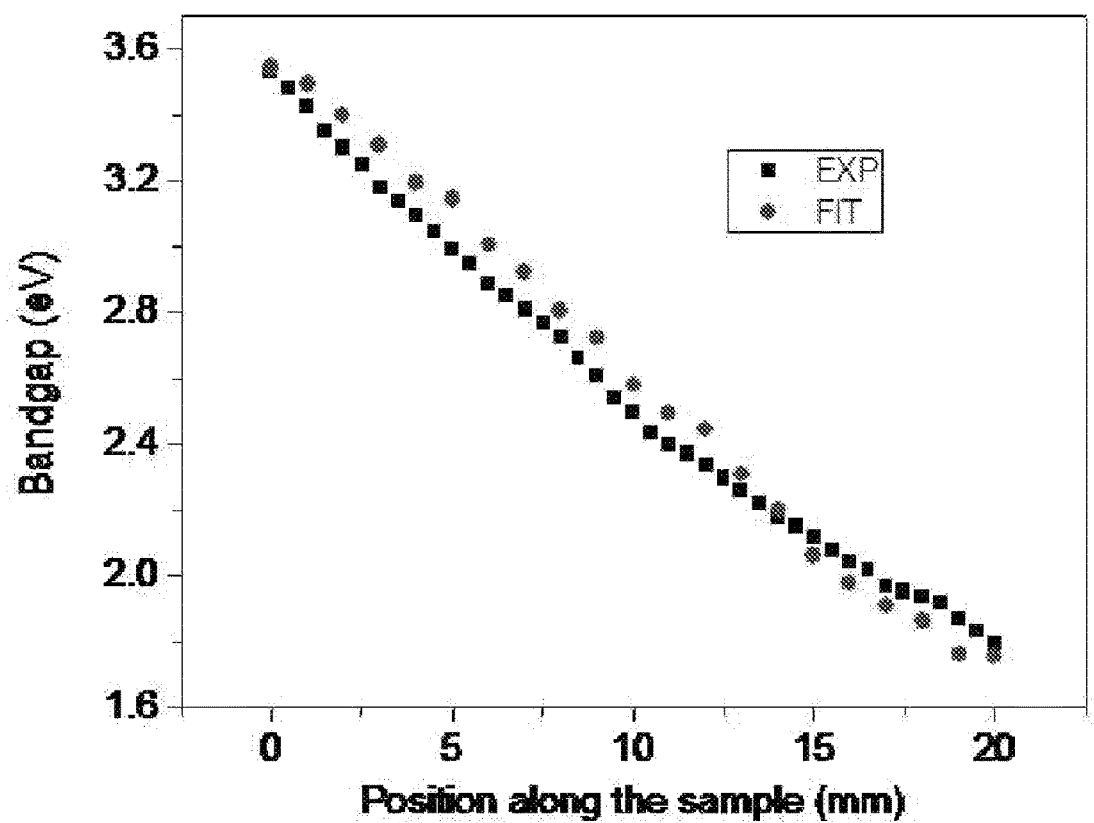
FIG. 17 shows the bandgap (circles) and PL peaks (squares) versus coordinate along the length of the substrate of Example 5.

FIG. 16 shows a real-color photograph of the sample under UV illumination (top) and the microscopic photoluminescence (PL) measurement at various spots along the length of the sample. The color change along the wafer is a direct result of bandgap change due to the composition grading along the substrate. This is consistent with the position-dependent composition analysis (see FIG. 14b). FIG. 17 shows a comparison of the PL peaks and bandgaps of the alloys at various locations along the substrate. The bandgaps were obtained through the typical interpolation relation using the bandgaps of the binaries (ZnS and CdSe) and their corresponding compositions obtained by the spatial EDS profiling. The agreement between the PL peaks and the bandgaps indicates a good stoichiometry of the quaternary alloys along the substrate.

Example 6

Wavelength Specific Lateral Multijunction Solar Cells

Parallel multi-junctions with a single absorption cell were proposed and studied earlier (see, Green and Wenham, *Appl. Phys. Lett.*, 65, 1994, 2907) to mainly improve the charge collection efficiency. To maximize the benefits of our unique materials for photovoltaic applications, we propose several parallel (or lateral) multi junction designs where each junction with a given bandgap range is optimized for the corresponding spectral band of solar radiation. As shown in FIG. 18, broad-band solar light is first dispersed into various wavelength bands by thin film gratings or dispersive concentrators (see, Bloss et al., *Appl. Opt.*, 21, 1982, 3739; Ludman, *Appl. Opt.*, 21, 1982, 3057). Different wavelength bands propagating at different angles will reach the solar absorption layer at different spatial locations or junctions, with i-th junction characterized by junction areas, wavelength window and bandgap ranges, ($\Delta S_i$, $\Delta \lambda_i$, $\Delta E_i^g$), respectively. Each of the lateral junctions has its own p-n contacts allowing carriers generated to be collected separately. The use of dispersive concentrator is especially important when many junctions are desired so that enough carriers are generated to have significant open circuit voltage for each junction.

Using our unique spatial composition graded alloy nanowires, the entire absorption layer with multiple lateral junctions can be grown in a single run of CVD growth monolithically on a single substrate. One of the advantages of our designs using the composition graded alloys is that potentially many more junctions can be realized than feasible with other technologies available. In fact, the number of junctions and the bandgap distributions can be unlimited and thus can be completely left to be determined by the efficiency optimization. Since the nanowires are grown using the standard CVD, our approach provides a unique opportunity of exploring the theoretical limit of multijunction solar cell efficiency by using inexpensive technology.

Example 7

Quaternary Alloy Semiconductor Nanowires with Bandgap Spanning the Entire Visible Spectrum Here we demonstrate the growth of quaternary semiconductor alloy nanostructures using an example of $Zn_xCd_{1-x}S_ySe_{1-y}$ (0≤x,y≤1) nanowires. We also achieved a controllable variation of the alloy compositions, leading to a tunable bandgap change in the entire visible spectrum. Such unique nanostructured materials with controllable alloy composition will open a wide range of applications in color engineered display and lighting, multispectral detectors, full-spectrum solar cells, and superbroadly tunable nanolasers.

The quaternary ZnCdSSe nanowires were synthesized through an improved co-thermal evaporation route in the presence of Au as a catalyst. As shown in FIG. 19, a ¼"-diameter quartz minitube was placed horizontally inside a 1"-diameter quartz tube for transporting the reaction reagent vapors in a confined space to the downstream reaction zone.

Before growth, some amount of commercial-grade ZnS and CdSe (Alfa Aesar, 99.995% purity) were loaded independently at two different locations inside the minitube. ZnS powder was positioned at the center of the furnace, while CdSe powder was placed upstream and 12.5 cm from the center of the furnace. A piece of quartz sheet presputtered with 5 nm of Au film was positioned downstream of the system, about 14 cm away from the center of the furnace. The substrate (5 mm in length) was placed at a position with a temperature of about 925° C., which falls within the temperature zone needed for growing both ZnS and CdSe nanowires. Once we make sure that the substrate placed at a given location can collect the source vapor during the growth, the composition of the alloy nanowires can be adjusted by changing the molar ratio of the two source powders (ZnS/CdSe).

The tube reactor was evacuated and back-flushed with $Ar/H_2$-5% gas until the desired pressure of 50 Torr was reached. A constant flow of 50 sccm was used during the growth. The temperature at the furnace center was set to 1050° C. with a heating rate of 40° C./min and maintained at its peak temperature for 30 min. The temperature of the locations where ZnS and CdSe powder loaded is 1050° C. and 970° C., respectively. Quaternary alloy nanowires with different compositions can be achieved by changing the relative molar ratio of ZnS and CdSe in the source materials.

Figure 20:
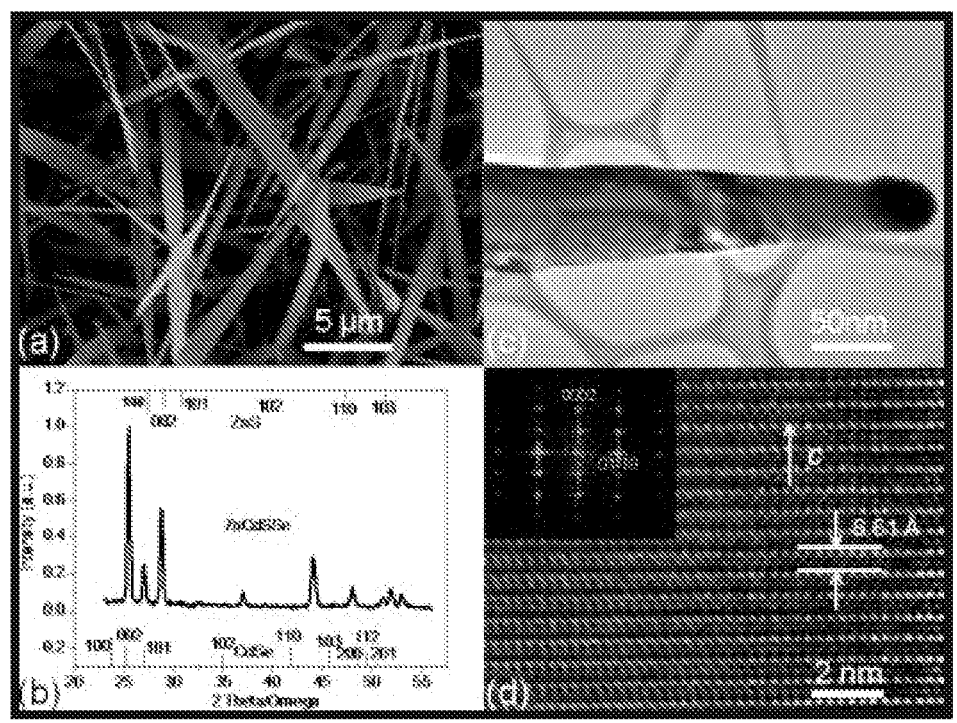
FIG. 20 shows (a) Typical SEM morphology of the obtained quaternary $Zn_xCd_{1-x}S_ySe_{1-y}$ nanowires; (b) XRD pattern of a representative nanowire sample; (c and d) TEM image of a single quaternary nanowire and its corresponding HRTEM image and FFT pattern (inset).

FIG. 20a shows the representative scanning electron microscopy (SEM) images of the as-prepared quaternary semiconductor samples. The SEM result indicates that all the samples with different alloy compositions have a similar belt-like morphology, with a typical length of 20 μm-60 μm and width of 1 μm-2 μm. All the belts taper at the growing end with the size down below 50 nm at the tip. The SEM-equipped energy-dispersive X-ray spectroscopy (EDX) analysis demonstrates that all the as-grown nanowire samples are composed of elements Zn, Cd, S, and Se. X-ray diffraction (XRD) analysis indicates that $_{all}$ the as-grown samples have a pure hexagonal crystallographic phase, with diffraction peaks in between those of hexagonal ZnS and CdSe single crystals (see FIG. 20b for the XRD pattern of a representative sample and the standard 2θ values for wurtzite ZnS and CdSe single crystals). Transmission electron microscopy (TEM) was used to further investigate the microstructures of single quaternary alloy belts. FIG. 20c shows the representative TEM image of the achieved quaternary alloy nanowires, with a catalyst particle at the tip, indicating the metal catalyzed Vapor-Liquid-Solid growth of the belts. The high-resolution TEM (HRTEM) observations (FIG. 20d) as well as its corresponding fast Fourier transform (FFT) analysis (see the inset) demonstrate that the obtained nanowires have single-crystal and wurtzite hexagonal structure, which is consistent with the XRD measurements (FIG. 20b). The measured (0001) interplanar spacing (c value) is also in good agreement with that deduced from the XRD patterns. All these macro- and microstructural characterizations support the formation of quaternary ZnCdSSe nanostructured alloys.

Scanning transmission electron microscopy X-ray energy dispersive spectrometry (STEM-XEDS) was utilized to further investigate the nanoscale elemental composition as well as the spatial uniformity of element distribution in the quaternary alloy belts. EDX (energy-dispersive x-ray spectroscopy) data collected from a single point in the belt, confirmed the existence of elements Zn, Cd, S, and Se in single nanowires. without any apparent element separation or aggregation, demonstrating that all the four elements, Zn, Cd, S, and Se, are very homogeneously distributed across the belts. The EDX analysis from several selected points along the length of a single belt indicated that the composition is also uniform along the full length of the nanowires.

The composition of alloy nanowires is usually determined by the relative ratio of source materials and the deposition temperature on the substrate. For a short substrate, the substrate temperature depends on its location along the tube axis. Thus alloy composition can be controlled by the source materials ratio, by substrate location, or a combination of the two. At a fixed location, the alloy compositions of the belts can be easily varied through changing the molar ratio of the two source powders (ZnS/CdSe). Table 1 gives the composition (X and y) information deducted from EDX analysis of several representative $Zn_xCd_{1-x}S_ySe_{1-y}$ (0≤x,y≤1) alloy nanowire samples.

TABLE 1

Composition, PL peak value and interpolated bandgaps of several representative quaternary $Zn_xCd_{1-x}S_ySe_{1-y}$ nanowire samples

| | Sample No. | | | | | |
|---|---|---|---|---|---|---|
| | 1 | 2 | 3 | 4 | 5 | 6 |
| x | 0.961 | 0.731 | 0.483 | 0.252 | 0.085 | 0.005 |
| y | 0.915 | 0.575 | 0.340 | 0.238 | 0.149 | 0.146 |
| PL Peak Value (eV) | 3.40 | 2.92 | 2.48 | 2.15 | 1.89 | 1.75 |
| Interpolated Bandgap (eV) | 3.48 | 2.96 | 2.49 | 2.17 | 1.92 | 1.83 |

Figure 21:
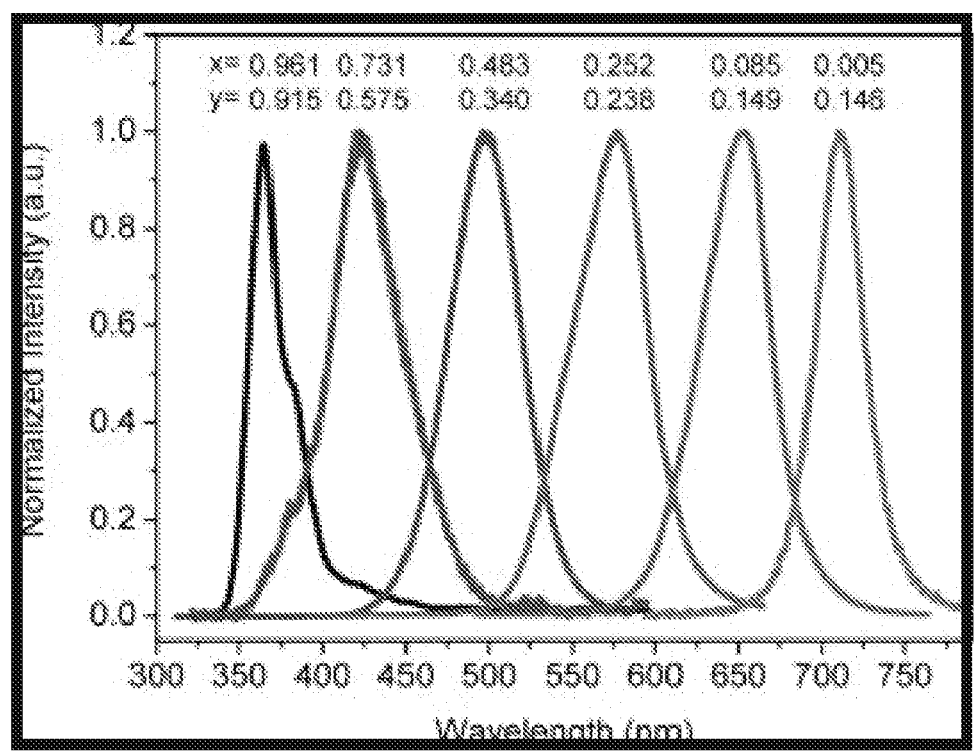
FIG. 21 shows normalized PL spectra of the achieved quaternary $Zn_xCd_{1-x}S_ySe_{1-y}$ nanowires excited with a pulsed frequency-quadrupled Nd: YAG laser (266 nm). The data above the spectra show the relative composition x and y values.

FIG. 21 presents their corresponding normalized photoluminescence (PL) spectra, using a pulsed frequency-quadrupled Nd:YAG laser (266 nm) as the pump source. The spectra of $_{all}$ samples show a single emission band, with the peak wavelength continuously shifted from 361 to 712 nm covering the entire visible region. The standard interpolation formula for quaternary semiconductor alloys $A_xB_{1-x}C_yD_{1-y}$ (see, Tamargo, M. C. *II-VI semiconductor materials and their applications*; Taylor & Francis: New York, 2002) was used to obtain the band gap of $Zn_xCd_{1-x}S_ySe_{1-y}$ alloys as functions of composition variables x and y (see, Feng et al., *J. Appl. Phys* 1993, 74, 3948). The PL peak values for each of the nanowire samples and the corresponding interpolated band gap values are also shown in Table 1. The high degree of consistence between the spectral measurements and the interpolations demonstrates that the peak position tunable PL of the quaternary nanowires comes from the composition related band edge emission of the alloy semiconductors. At the same time, the continuous shift of the PL bands for the obtained alloy belts with their compositions gives further evidence for the formation of uniform quaternary $Zn_xCd_{1-x}S_ySe_{1-y}$ alloys via intermixing the wide band gap of ZnS and the narrow band gap of CdSe, rather than the formation of the independent binary or ternary phases, in good agreement with the results of nanoscale 2-D elemental mapping. In addition, all of the quaternary belt exhibits a single band edge emission, without any defect or structural disorder-related low-energy emission detected, further demonstrating that the obtained nanostructures are highly crystallized with few defects, which is also consistent with the HR-TEM observations.

In summary, we used a co-thermal evaporation route to achieve quaternary alloy semiconductor nanostructures, using $Zn_xCd_{1-x}S_ySe_{1-y}$ nanowires as an example. The composition of the achieved alloys can be tuned by controlling the molar ratio of the source materials, resulting in their band edge light emission to be continuously tunable across the entire visible spectrum. Such widely controlled alloy nanostructures provide a new material platform for a wide range of applications from wavelength-tunable lasers, multicolor detectors, full-spectrum solar cells, LEDs, to color displays.

Example 8

Two-Dimensionally Varying ZnCdSSe Alloy Layers

Experimental growth of quaternary ZnCdSSe nanowires with spatial composition grading was conducted through an CVD route in the presence of Au as a catalyst. For the growth of a 2-D graded sample, three ¼"-diameter quartz mini-tubes were placed horizontally inside a 1½"-diameter quartz tube, forming an equilateral triangle, for transporting the reaction reagents independently to the reaction zone.

Figure 22:
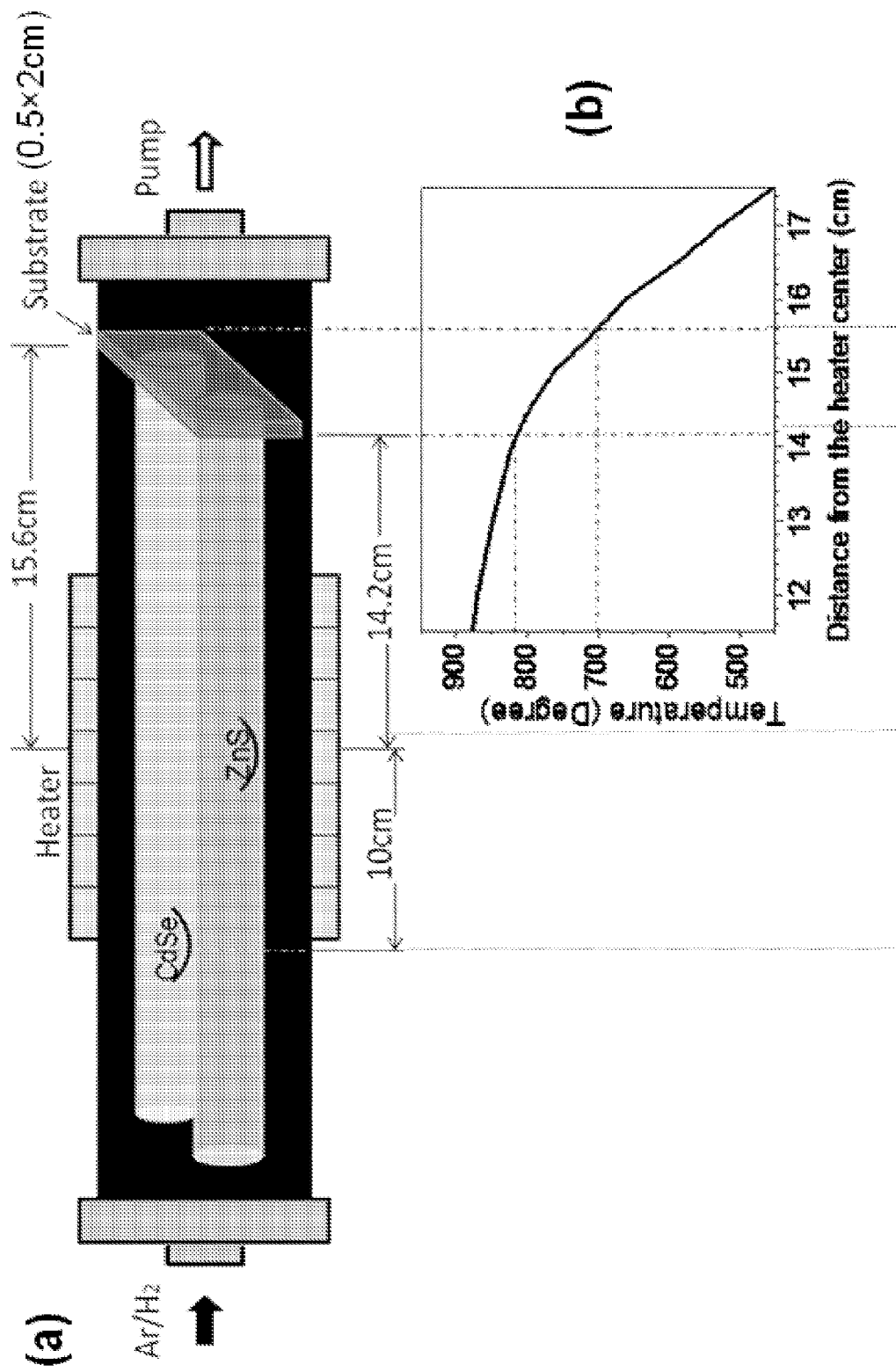
FIG. 22 shows (a) setup and tube configuration for the growth of a 1-D graded sample, (b) temperature profile at the sample growth zone, and (c) setup and tube configuration for the growth of the 2D graded sample.

Before growth, appropriate amount of high-purity ZnS, CdSe, and CdS source powders (Alfa Aesar, 99.995%) were loaded into the three mini-tubes separately. ZnS powder was positioned at the center of the furnace, while CdSe powder was placed upstream of the furnace center. The CdS powder was placed at the same longitudinal position as the CdSe powder. A piece of quartz (3 cm×3 cm in size) pre-sputtered with 2 nm of Au film was positioned downstream facing the ends of the mini-tubes. The substrate was tilted into a proper angle, such that its two ends are at the different axial locations with different temperatures and so that the end of the ZnS-carrying tube points to the higher temperature side of the substrate. The reactor conditions are schematically shown in FIG. 22.

The tube reactor was evacuated and back-flushed with Ar/$H_2$-5% gas until the desired pressure of 15 torr was reached. A constant flow of 50 sccm was used during growth. The temperature at the furnace center was set to 940° C. with a heating rate of 40° C./min, and maintained at its peak temperature for 2 min. During the growth, the vapors coming from the two neighboring mini-tubes will spread and inter-disperse along the length of the substrate, thus forming spatial composition-graded alloys on the substrate. In addition to the spatial configuration of mini-tubes, the existence of temperature gradient along the substrate is allows for the growth, since ZnS and CdSe have different deposition temperatures.

Figure 23A:
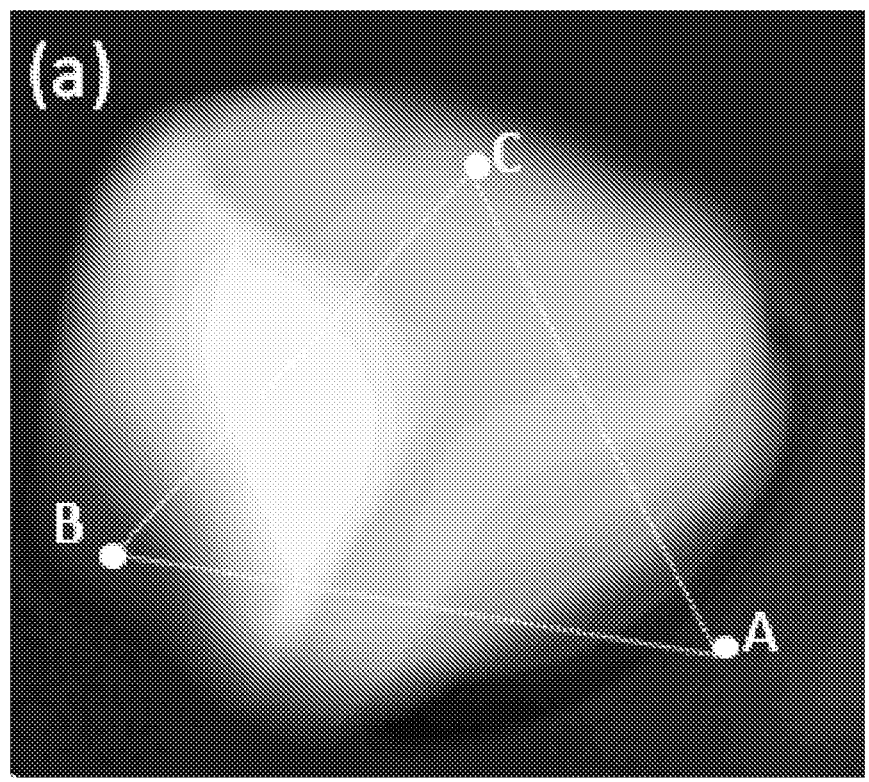
FIG. 23 shows (a) a photograph of the sample with 2-D composition grading under UV light illumination; positions A, B and C in (a) are close to the down-stream ends of the mini-tubes loaded with ZnS, CdSe and CdS powder, respectively; (b)-(d) element profiles along the three sides of the indicated triangle shown in FIG. 23a (b, along A-B; c, along A-C; d, along C-B), and (e)-(g) the $Zn_xCd_{1-x}S_ySe_{1-y}$ corresponding converted composition x and y with position (e, along A-B, f, along A-C, g, along C-B).
Figure 23B:
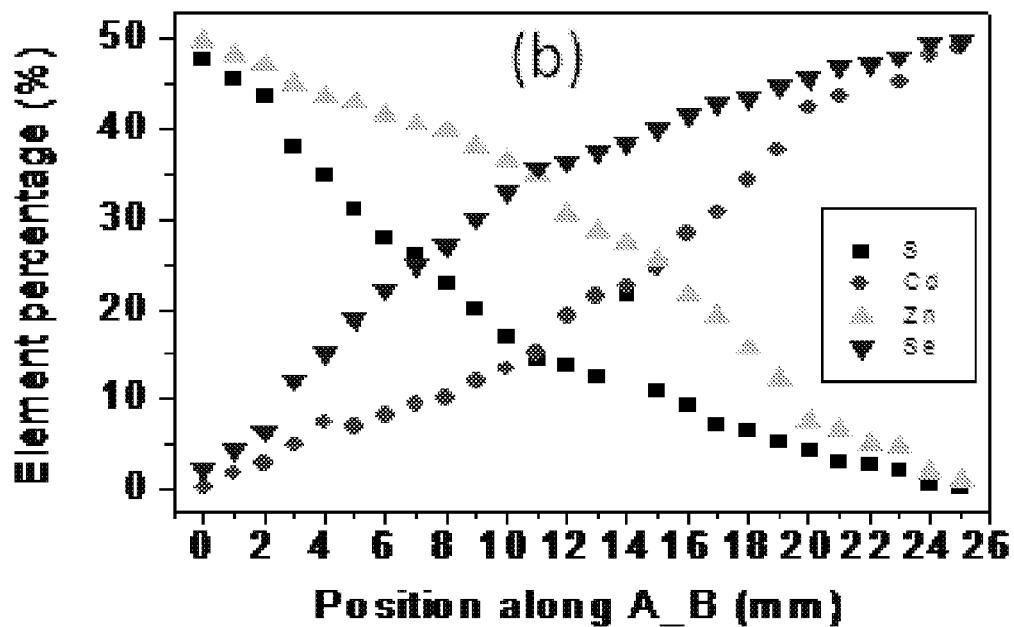
Figure 23C:
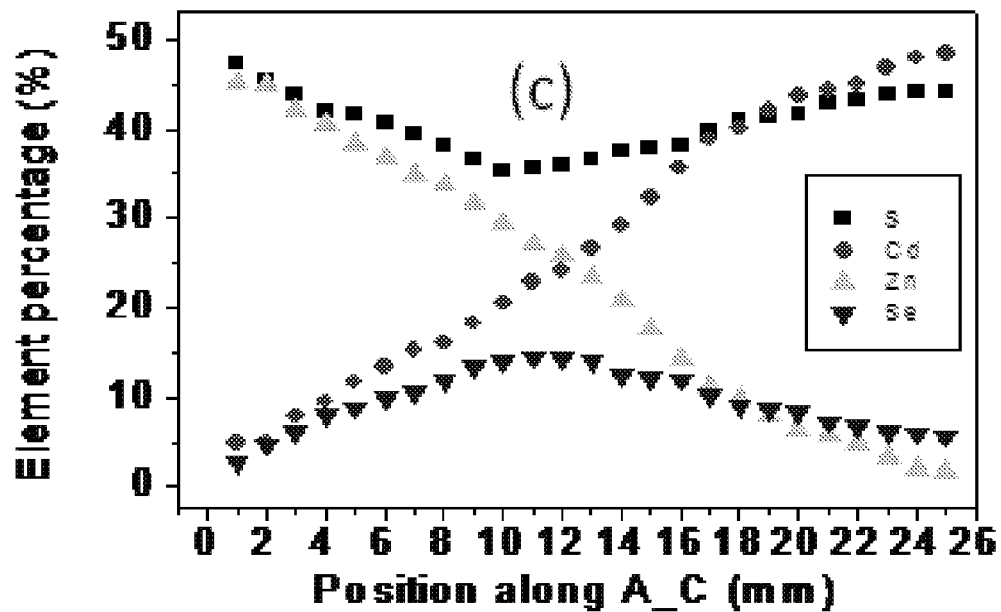
Figure 23D:
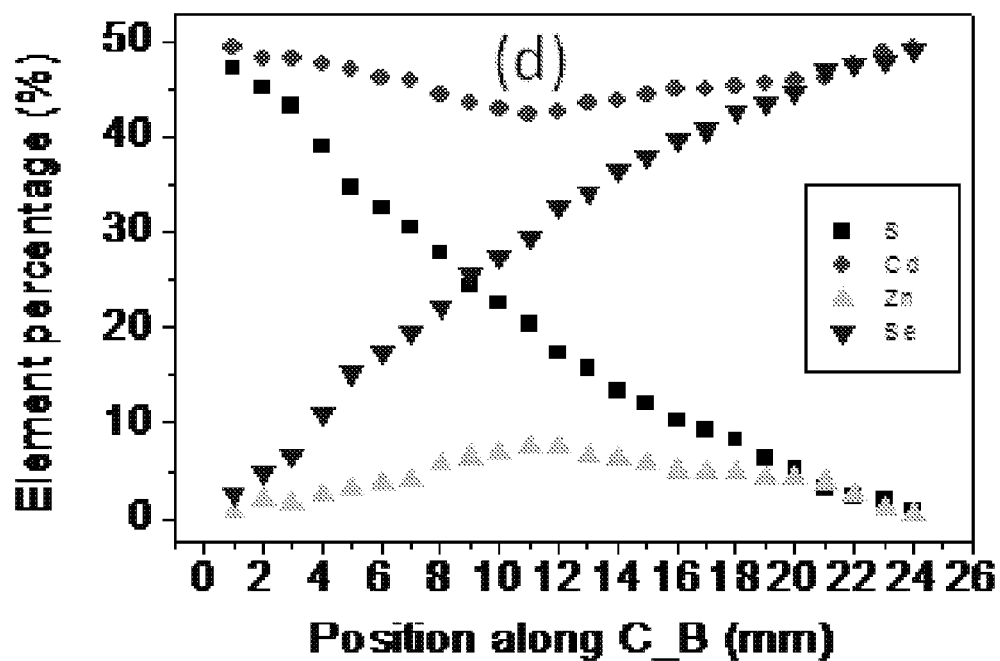
Figure 23E:
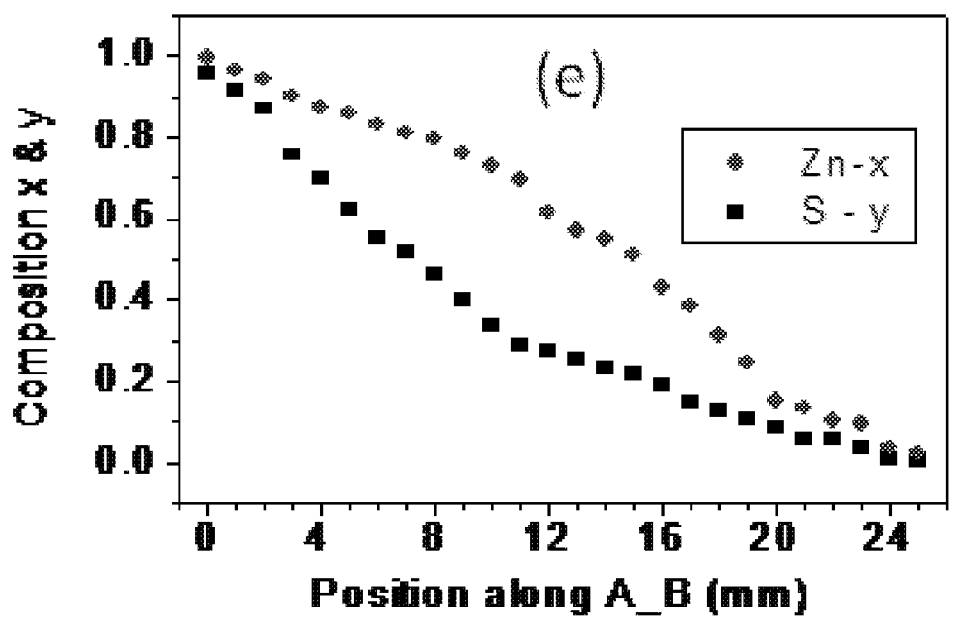
Figure 23F:
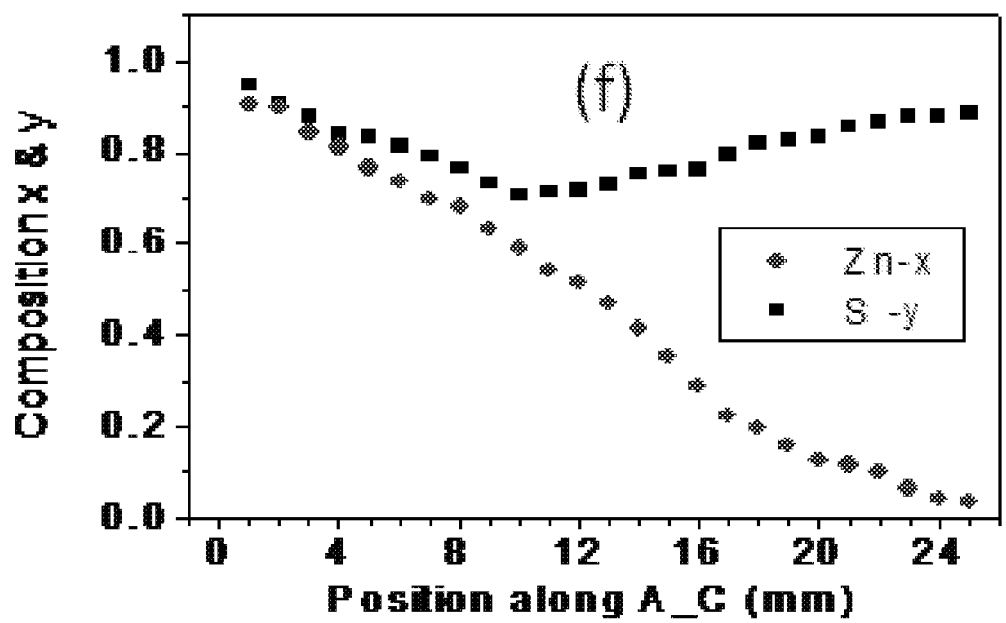
Figure 23G:
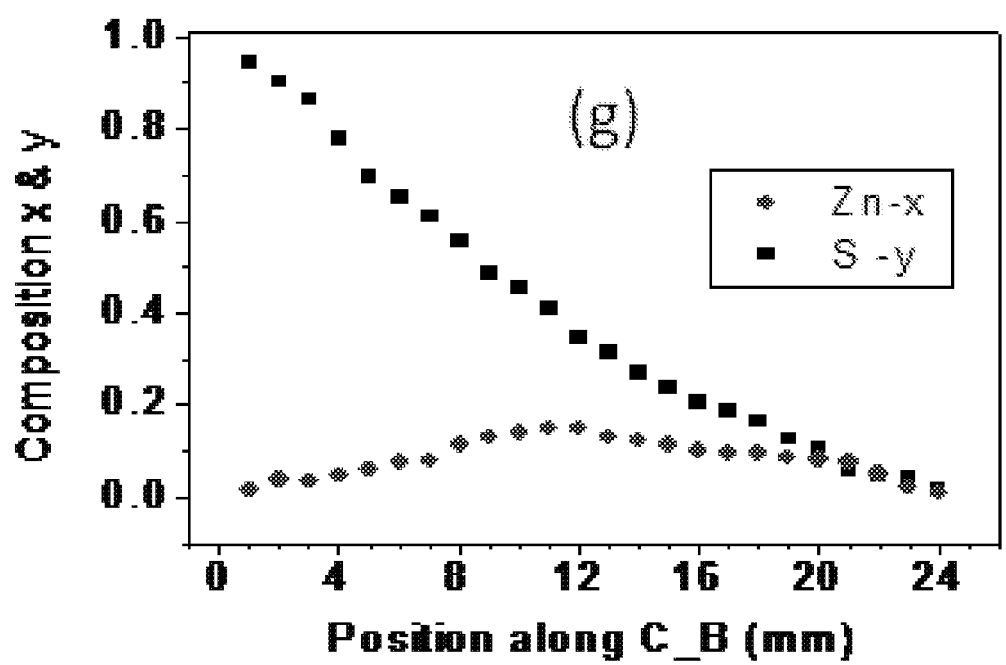

FIG. 23a shows a photograph of the as-grown 2D graded sample under UV light illumination, grown using the setup with three mini tubes arranged in an equal lateral triangle (see FIG. 22c). Positions A, B and C in FIG. 23a are close to the down-stream ends of the mini-tubes loaded with ZnS, CdSe and CdS powder, respectively. FIGS. 23b to 23d show the respective element profiles along the three sides of the indicated triangle shown in FIG. 23a, and FIGS. 23e to 23g are the corresponding converted composition x and y with position along the sides of the triangle. These spatial compositional results combined with the SEM observations (not shown here) indicate that the whole substrate range is also composed of quaternary ZnCdSSe nanowires. As a result, this photograph (FIG. 23a) exhibits a 2-D spatial graded composition in the plane of the substrate.

Figure 24A:
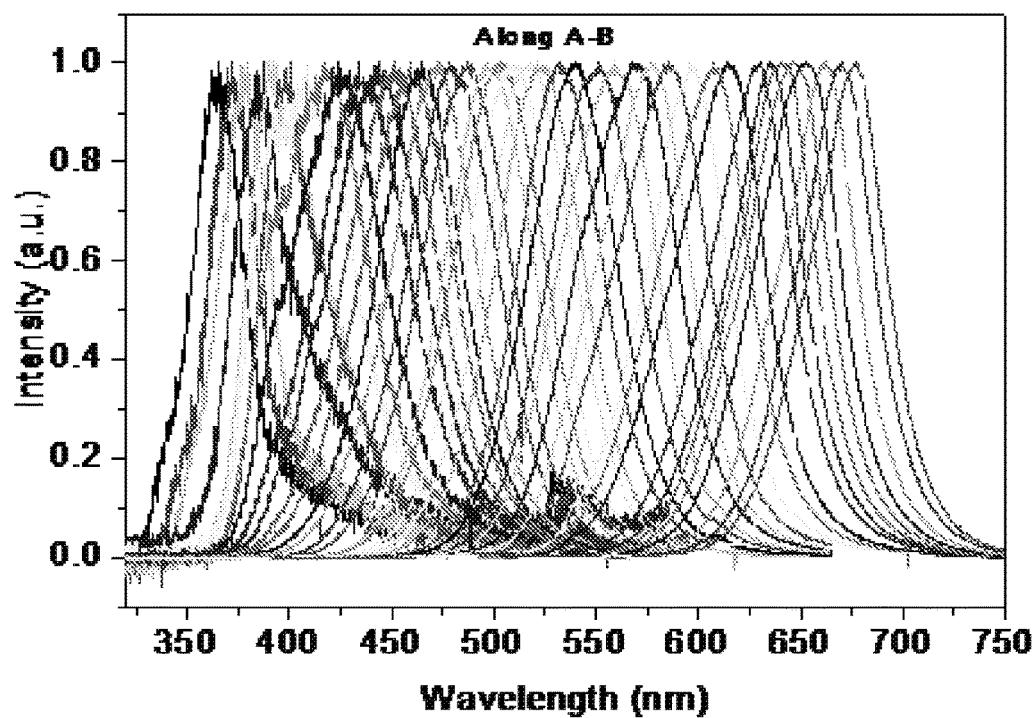
FIG. 24 shows the normalized spectra of the 2D graded sample along each side of the triangle ABC: (a) along A-B; (b), along C-B; (c), along A-C; and (d) shows the corresponding position dependent PL peak wavelength energy along the triangle (A-B, squares; A-C, circles; C-B, triangles).
Figure 24B:
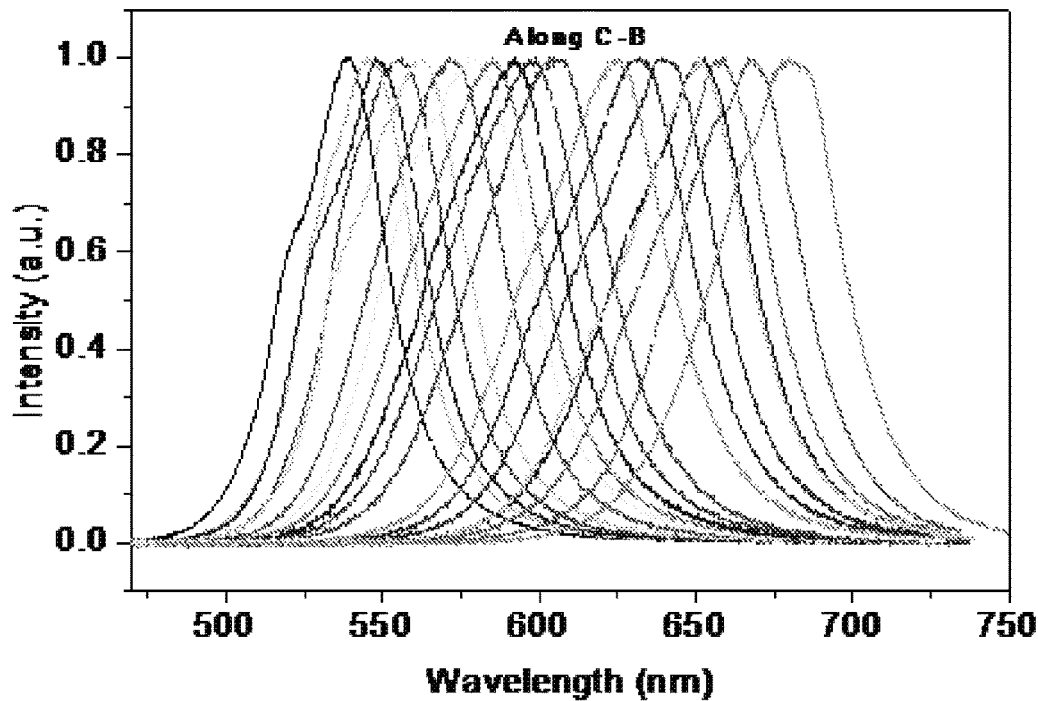
Figure 24C:
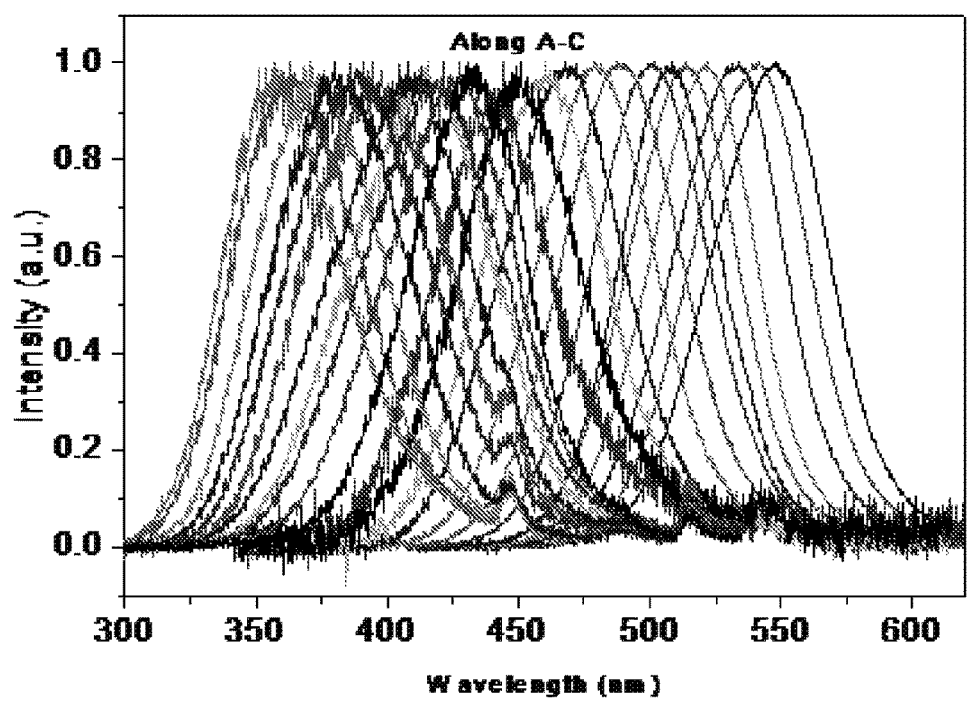
Figure 24D:
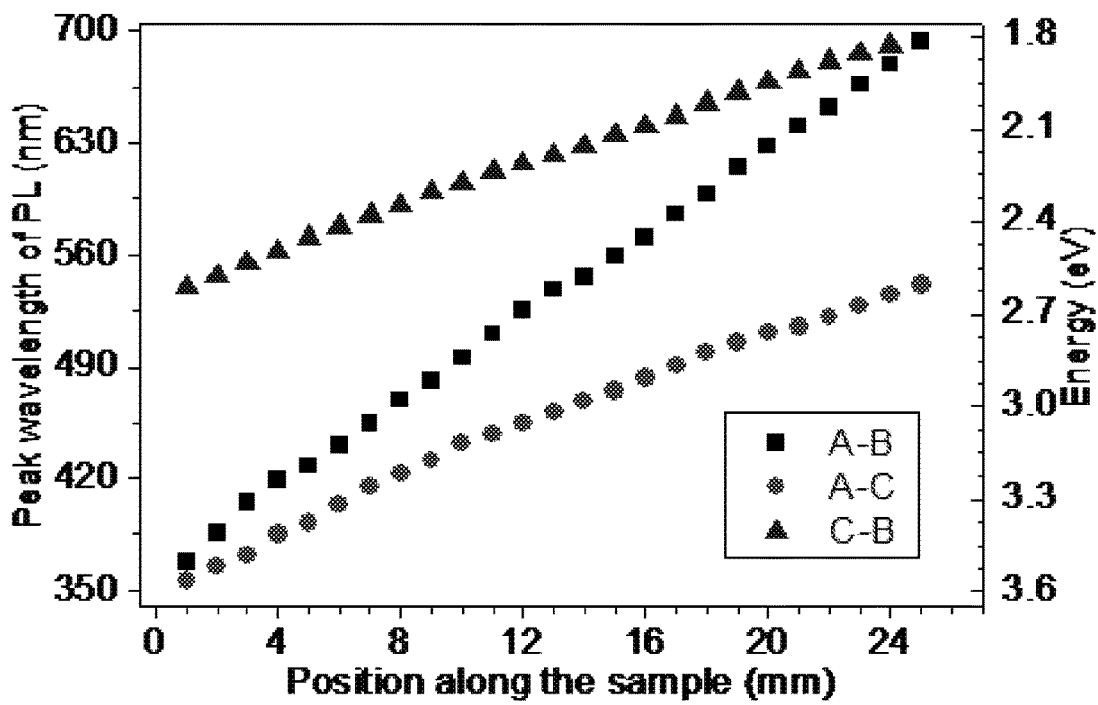

FIGS. 24a to 24c show the normalized spectra of the 2D graded sample along each side of the triangle ABC, respectively, and FIG. 24d gives the corresponding position dependent PL peak wavelength/energy along the triangle. Just as in the case of the 1D graded alloys, the PL spectra from every spot along the sides of the triangle all show strong single-peak band-edge emission, with their peak wavelength tunable with the position.

Figure 25:
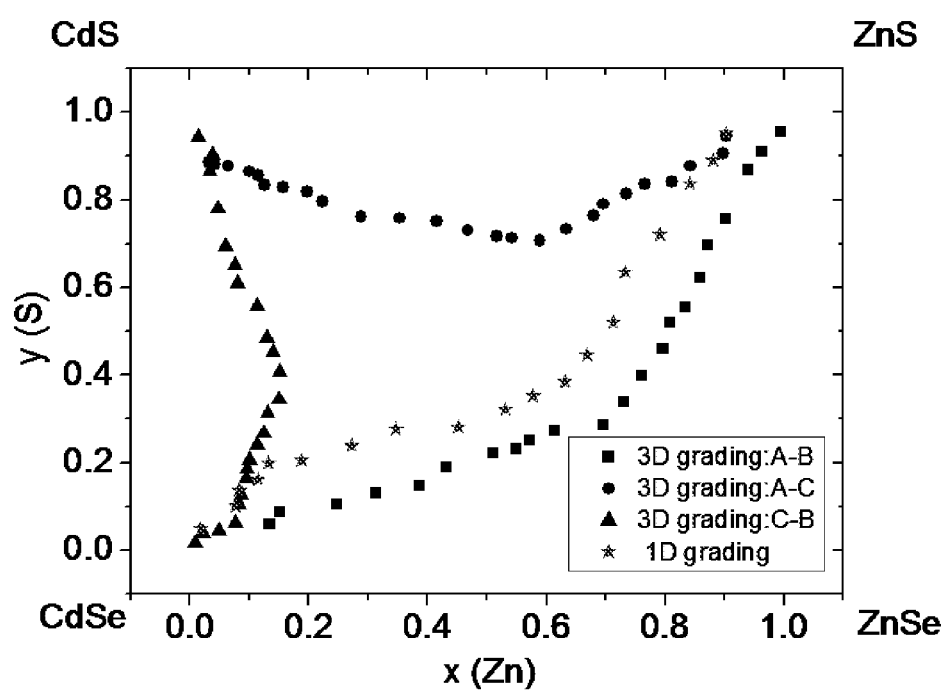
FIG. 25 shows the compositional x-y relations for the 1-D composition grading (stars), and the 2-D grading along the three sides of the triangle ABC (A-B, squares; A-C, circles; C-B, triangles), respectively.

FIG. 25 shows the compositional x-y plane for quaternary $Zn_xCd_{1-x}S_ySe_{1-y}$ alloys. The four corner points denote the four binary compounds, ZnS, ZnSe, CdS and CdSe, respectively. Theoretically, x and y are two independent composition variables and every point inside the unit square represents an allowed quaternary alloy of $Zn_xCd_{1-x}S_ySe_{1-y}$ (0<x, y<1). But a given spatial PL scan along a particular path on the substrate reveals a particular x-y combination or an x-y dependence. Such a PL scan will define a curve in the x-y plane. For example, while the 1D graded sample has only one set of x-y relation, which is represented as one curve (shown as stars in FIG. 25), the 2D graded sample can have many sets of x-y relations, or many curves in the x-y plane, depending on the scanning path. As representatives, the compositional x-y relations for the scanning along the three sides of the triangle are shown in FIG. 25 (see rectangles, circles and triangles). As shown above, the compositional spatial distribution of the ZnCdSSe alloys on the substrate can be well controlled by the spatial configurations of the multi-tunnel growth system together with the proper temperature profile at the growth zone. This approach of alloy growth and spatial composition control can be easily extended to other ternary or multi-element alloy systems, providing a general strategy for achieving spatially controlled semiconductor alloy nanostructures.

We have shown that our approach can achieve alloy composition control in two space-dimensions. Since alloys of different alloy compositions in general require different deposition temperatures, pure spatial source materials profiling through mini-tube configuration is not sufficient to grow high quality nanowires. The inclusion of a temperature gradient allows this method to be used generally to produce spatially controlled alloy composition variations in other alloy systems. Such composition controlled alloy nanowires on a single substrate provide a unique material platform for a wide range of applications from color engineered display and lighting, full spectrum solar cells, multispectral detectors or spectrometer on-a-chip, to super-broadly tunable nanolasers.

The present invention is illustrated by way of the foregoing description and examples. The foregoing description is intended as a non-limiting illustration, since many variations will become apparent to those skilled in the art in view thereof. It is intended that all such variations within the scope and spirit of the appended claims be embraced thereby. Each referenced document herein is incorporated by reference in its entirety for all purposes.

Changes can be made in the composition, operation and arrangement of the method of the present invention described herein without departing from the concept and scope of the invention as defined in the following claims.

We claim:

1. A semiconductor structure comprising a substrate and a II-VI alloy layer having an elemental composition formed over a surface of the substrate, wherein the elemental composition of the II-VI alloy layer laterally continuously varies between a first II-VI compound or alloy at a first position over the surface of the substrate and a second II-VI compound or alloy at a second position over the surface of the substrate, and wherein the II-VI alloy layer laterally varies with respect to a first pair of II-VI compounds selected from the constituent compounds of the first and second II-VI compounds or alloys, wherein from the first to second positions, one of the first pair of II-VI compounds continuously increases in compositional abundance of the II-VI alloy layer and the other II-VI compound of the first pair continuously decreases in compositional abundance of the II-VI alloy layer.

2. The semiconductor structure of claim 1, wherein each II-VI compound or alloy independently comprises a (CdZnMgHg)(SSeTe) compound or alloy.

3. The semiconductor structure of claim 2, wherein each II-VI compound or alloy is a $CdS_{1-z}Se_z$ compound or alloy.

4. The semiconductor structure of claim 3, wherein z is about 0 at the first position and about 1 at the second position.

5. The semiconductor structure of claim 2, wherein each II-VI compound or alloy is a $Cd_{1-a}Zn_aS$ compound or alloy.

6. The semiconductor structure of claim 5, wherein a is about 0 at the first position and about 1 at the second position.

7. The semiconductor structure of claim 1, wherein the II-VI alloy layer further varies between the second II-VI compound or alloy at the second position and a third II-VI compound or alloy at a third position over the surface of the substrate.

8. The semiconductor structure of claim 7, wherein from the second to the third position, the II-VI alloy layer varies with respect to a second pair of II-VI compounds selected from the constituent compounds of the second and third II-VI compounds or alloys, wherein
one II-VI compound of the second pair continuously increases in compositional abundance of the II-VI alloy layer and the other II-VI compound of the second pair continuously decreases in compositional abundance of the II-VI alloy layer.

9. The semiconductor structure of claim 8, wherein each II-VI compound or alloy is a $Cd_{1-x}Zn_xS_{1-y}Se_y$ alloy.

10. The semiconductor structure of claim 9, wherein
y is about 1 at the first position and about 0 at the second position; and
x is essentially constant between the first and second positions.

11. The semiconductor structure of claim 10, wherein
x is about 0 at the second position and about 0.6 at the third position; and
y is essentially constant between the second and third positions.

12. The semiconductor structure of claim 9, wherein
x is about 0 and y is about 1 at the first position; and x is about 1 and y is about 0 at the second position.

13. The semiconductor structure of claim 1, wherein the laterally varying II-VI alloy layer comprises nanowires.

14. The semiconductor structure of claim 1, wherein the substrate comprises Si or $SiO_2$.

15. The semiconductor structure of claim 1, wherein the first and second positions are separated by a distance about 2 cm or less.

16. The semiconductor structure of claim 1, wherein the first and second positions are separated by a distance of about 0.5 cm to 5 cm.

17. The semiconductor structure of claim 1, further comprising a catalyst layer formed directly on the substrate, wherein the laterally varying II-VI alloy layer is formed directly on the catalyst layer.

18. The semiconductor structure of claim 17, wherein the catalyst layer is a patterned layer.

19. The semiconductor structure of claim 17, wherein the catalyst layer comprises Au.

20. The semiconductor structure of claim 1, further comprising one or more electrical contacts in electrical communication with the II-VI alloy layer.

21. The semiconductor structure of claim 20, wherein each electrical contact is an interdigitated electrode.

22. The semiconductor structure of claim 20, wherein one of the substrate and the electrical contact is p-doped and the other is n-doped.

23. The semiconductor structure of claim 20 comprising a plurality of electrical contacts each at one of a plurality of positions in electrical communication with the II-VI alloy layer.

24. A method for preparing a laterally composition-varying II-VI alloy layer over at least a portion of a surface of a substrate comprising
contacting at least a portion of a surface of a substrate within a reaction zone with a chemical vapor under suitable reaction conditions to form a laterally composition-varying II-VI alloy layer over the portion of the surface of the substrate, wherein
the chemical vapor is generated by heating at least two II-VI binary compounds; and
the reaction zone has a temperature gradient of at least 50-100° C. along an extent of the reaction zone, wherein the extent is about 0.5 cm to about 5 cm in length.

25. A semiconductor structure prepared according to claim 24.

26. A $Zn_xCd_{1-x}S_ySe_{1-y}$ nanowire wherein x and y are each greater than or equal to 0 and less than or equal to 1.

27. A method for preparing $Zn_xCd_{1-x}S_ySe_{1-y}$ nanowires comprising contacting at least a portion of a surface of a substrate with a chemical vapor under suitable reaction conditions to form one or more $Zn_xCd_{1-x}S_ySe_{1-y}$ nanowires over the portion of the surface of the substrate, wherein the chemical vapor is generated by heating ZnS to a first temperature and CdSe to a second temperature that is less than the first temperature.

28. A $Zn_xCd_{1-x}S_ySe_{1-y}$ nanowire prepared according to claim 27.

29. A semiconductor structure comprising a substrate and a II-VI alloy layer having an elemental composition formed over a surface of the substrate, wherein
the elemental composition of the II-VI alloy layer continuously laterally varies among
(1) a first II-VI compound or alloy at a first position over the surface of the substrate and a second II-VI compound or alloy at a second position over the surface of the substrate;
(2) the second II-VI compound or alloy at the second position over the surface of the substrate and a third II-VI compound or alloy at a third position over the surface of the substrate; and
(3) the third II-VI compound or alloy at the third position over the surface of the substrate and the first II-VI compound or alloy at the first position over the surface of the substrate;
wherein the first, second, and third positions are not co-linear.

30. The semiconductor structure of claim 29, wherein each II-VI compound or alloy independently comprises a (CdZnMgHg)(SSeTe) compound or alloy.

31. The semiconductor structure of claim 30, wherein each II-VI compound or alloy is a $Zn_xCd_{1-x}S_ySe_{1-y}$ compound or alloy.

32. The semiconductor structure of claim 31, wherein
at the first position, the II-VI compound or alloy comprises ZnS;
at the second position, the II-VI compound or alloy comprises CdSe; and
at the third position, the II-VI compound or alloy comprises CdS.

33. A laser comprising a semiconductor structure of claim 1.

34. A solar cell comprising a semiconductor structure of claim 1.

35. A multispectral detector comprising a semiconductor structure of claim 1.

* * * * *